US010578684B2

(12) United States Patent
Cadugan et al.

(10) Patent No.: US 10,578,684 B2
(45) Date of Patent: Mar. 3, 2020

(54) MAGNETIC FIELD SENSOR HAVING MAGNETORESISTANCE ELEMENTS WITH OPPOSITE BIAS DIRECTIONS

(71) Applicant: Allegro MicroSystems, LLC, Manchester, NH (US)

(72) Inventors: Bryan Cadugan, Bedford, NH (US); Rémy Lassalle-Balier, Bures sur Yvette (FR); Alexander Latham, Harvard, MA (US); Paolo Campiglio, Arcueil (FR); Noémie Belin, Villejuif (FR)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 15/895,418

(22) Filed: Feb. 13, 2018

(65) Prior Publication Data

US 2019/0219643 A1    Jul. 18, 2019

Related U.S. Application Data

(63) Continuation-in-part of application No. 15/869,620, filed on Jan. 12, 2018, now Pat. No. 10,509,058.

(51) Int. Cl.
*G01R 33/09* (2006.01)
*G01R 15/20* (2006.01)
*G01R 33/00* (2006.01)

(52) U.S. Cl.
CPC ......... *G01R 33/096* (2013.01); *G01R 15/205* (2013.01); *G01R 33/0094* (2013.01); *G01R 33/0035* (2013.01)

(58) Field of Classification Search
CPC .............. G01R 33/096; G01R 33/0094; G01R 33/0035; G01R 15/205
See application file for complete search history.

(56) References Cited

U.S. PATENT DOCUMENTS 5,216,560 A * 6/1993 Brug ...................... G01R 33/09
324/252
5,561,368 A * 10/1996 Dovek ................. G01R 33/093
324/252

(Continued)

OTHER PUBLICATIONS

U.S. Appl. No. 16/157,317, filed Oct. 11, 2018, Lassalle-Balier et al.

(Continued)

*Primary Examiner* — Dominic E Hawkins
(74) *Attorney, Agent, or Firm* — Daly, Crowley, Mofford & Durkee, LLP

(57) ABSTRACT

A magnetic field sensor can include a substrate, a first magnetoresistance element disposed over the substrate and including a first maximum response axis and a first bias layer structure configured to generate a first bias magnetic field with a first magnetic direction between ninety degrees and sixty degrees relative to the first maximum response axis. The magnetic field sensor can also include a second magnetoresistance element disposed over the substrate and including a second maximum response axis parallel to the first maximum response axis and a second bias layer structure configured to generate a second bias magnetic field with a second magnetic direction parallel to the first magnetic direction and opposed to the first magnetic direction. The first and second magnetoresistance elements can each have a pair of electrical contacts for coupling to circuits.

53 Claims, 17 Drawing Sheets

(56) References Cited

U.S. PATENT DOCUMENTS

| | | | | |
|---|---|---|---|---|
| 6,166,539 | A * | 12/2000 | Dahlberg | B82Y 10/00 257/E43.005 |
| 6,501,678 | B1 * | 12/2002 | Lenssen | B82Y 25/00 257/E27.005 |
| 7,064,937 | B2 * | 6/2006 | Wan | B82Y 25/00 324/252 |
| 7,259,545 | B2 | 8/2007 | Stauth et al. | |
| 7,838,133 | B2 * | 11/2010 | Zhang | C23C 14/088 428/701 |
| 8,269,491 | B2 | 9/2012 | Cummings et al. | |
| 9,046,562 | B2 | 6/2015 | Cummings et al. | |
| 9,465,056 | B2 * | 10/2016 | Han | G01R 19/32 |
| 10,060,880 | B2 * | 8/2018 | Chen | G01N 27/745 |
| 2008/0258721 | A1 | 10/2008 | Guo et al. | |
| 2009/0237075 | A1 | 9/2009 | Koss | |
| 2010/0007344 | A1 * | 1/2010 | Guo | G01R 33/098 324/260 |
| 2010/0277971 | A1 | 11/2010 | Slaughter et al. | |
| 2015/0022196 | A1 | 1/2015 | Hebiguchi et al. | |
| 2015/0177286 | A1 * | 6/2015 | Fuji | G01R 33/0005 324/144 |
| 2015/0333254 | A1 * | 11/2015 | Liu | G01R 33/096 438/3 |
| 2016/0359103 | A1 * | 12/2016 | Fermon | G01R 33/093 |
| 2017/0314969 | A1 | 11/2017 | Ausserlechner et al. | |

OTHER PUBLICATIONS

U.S. Appl. No. 16/157,313, filed Oct. 11, 2018, Lassalle-Balier et al.
Allegro MicroSystems, LLC, "High Sensitivity, 1 MHz GMR-Based Current Sensor IC in Space-Saving Low Resistance QFN Package;" ACS70331; Dec. 1, 2017; 22 Pages.
U.S. Appl. No. 15/869,620, filed Jan. 12, 2018, Cadugan et al.
Notice of Allowance dated Aug. 22, 2019 for U.S. Appl. No. 15/869,620; 11 pages.
U.S. Appl. No. 16/507,552, filed Jul. 10, 2019, Lassalle-Balier et al.
U.S. Appl. No. 16/578,767, filed Sep. 23, 2019, Cadugan et al.

* cited by examiner

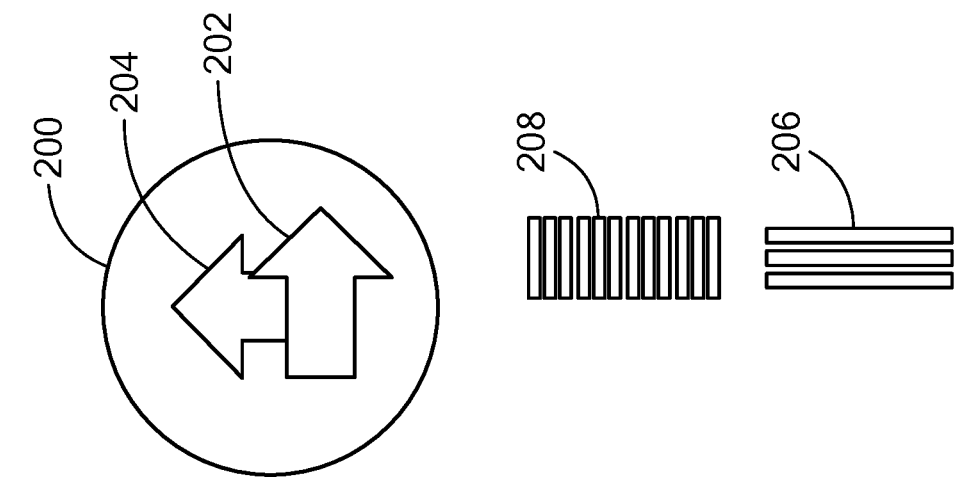
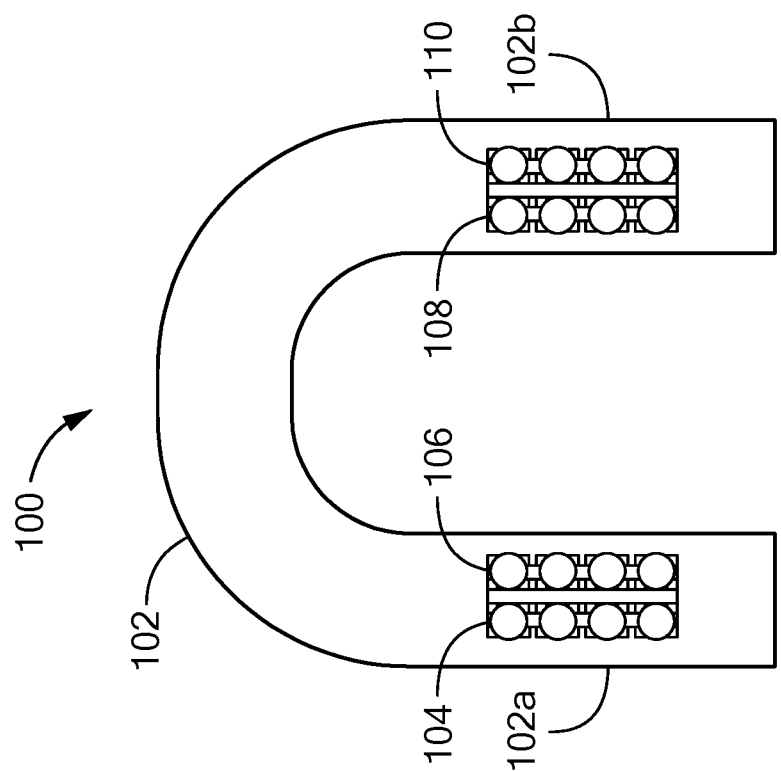
FIG. 2
FIG. 1

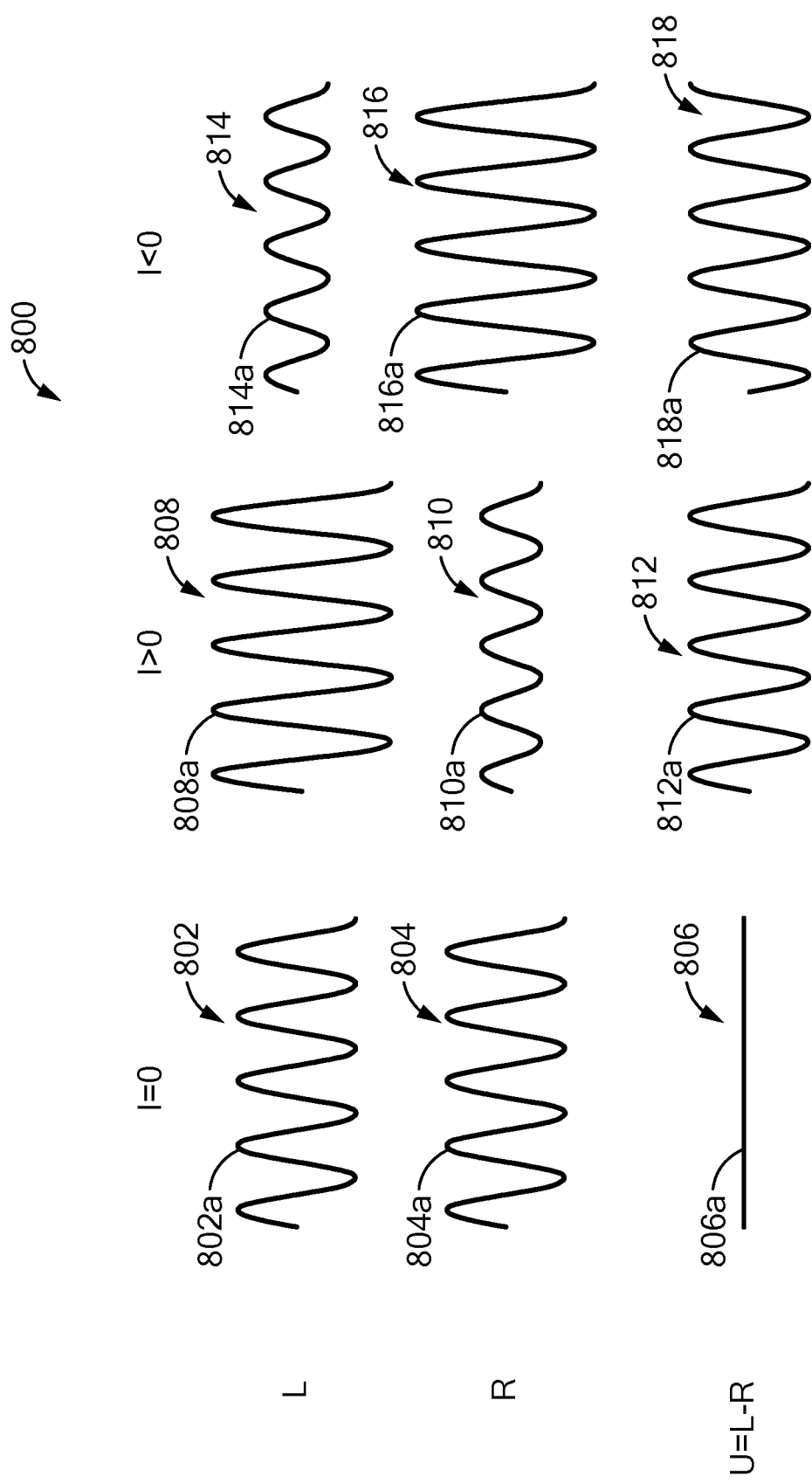

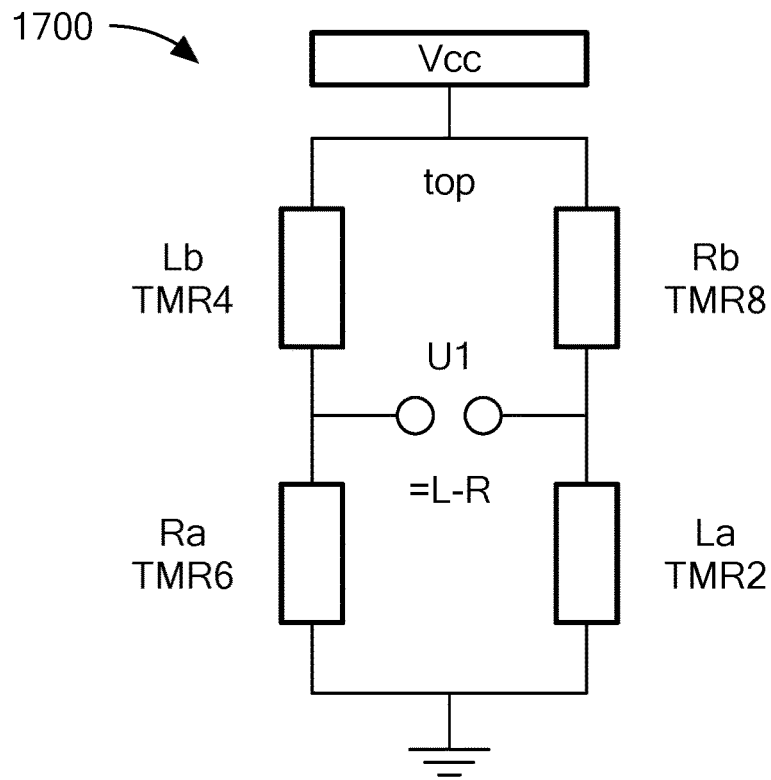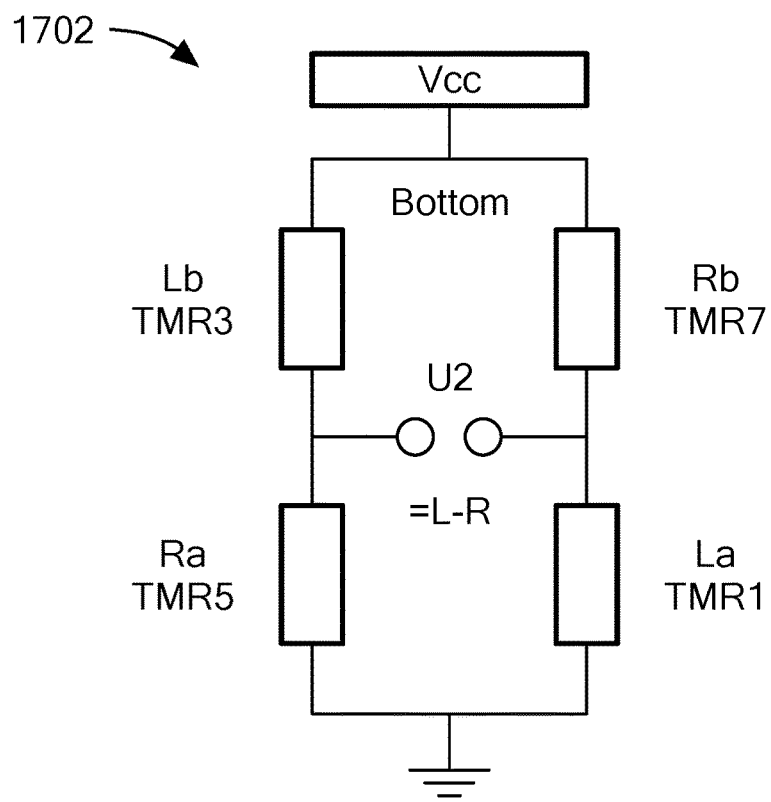
*FIG. 17*

MAGNETIC FIELD SENSOR HAVING MAGNETORESISTANCE ELEMENTS WITH OPPOSITE BIAS DIRECTIONS

CROSS REFERENCE TO RELATED APPLICATIONS

This application is a Continuation-In-part Applications of and claims the benefit of and priority to U.S. patent application Ser. No. 15/869,620, filed Jan. 12, 2018, which is incorporated by reference herein in its entirety.

STATEMENT REGARDING FEDERALLY SPONSORED RESEARCH

Not Applicable.

FIELD OF THE INVENTION

This invention relates generally to current sensors and, more particularly, to current sensors that use magnetoresistance elements, e.g., two magnetoresistance elements, with opposite bias directions.

BACKGROUND

As used herein, the term "magnetic field sensing element" is used to describe a variety of electronic elements that can sense a magnetic field. One such magnetic field sensing element is a magnetoresistance (MR) element. The magnetoresistance element has a resistance that changes in relation to a magnetic field experienced by the magnetoresistance element.

As is known, there are different types of magnetoresistance elements, for example, a giant magnetoresistance (GMR) element and a tunneling magnetoresistance (TMR) element, also called a magnetic tunnel junction (MTJ) element.

Of these magnetoresistance elements, the GMR and the TMR elements operate with spin electronics (i.e., electron spins) where the resistance is related to the magnetic orientation of different magnetic layers separated by nonmagnetic layers. In spin valve configurations, the resistance is related to an angular direction of a magnetization in a so-called "free-layer" relative to another layer so-called "reference layer." The free layer and the reference layer are described more fully below.

The magnetoresistances element may be used as a single element or, alternatively, may be used as two or more magnetoresistance elements arranged in various configurations, e.g., a half bridge or full (Wheatstone) bridge.

As used herein, the term "magnetic field sensor" is used to describe a circuit that uses one or more magnetic field sensing elements, generally in combination with other circuits. In a typical magnetic field sensor, the magnetic field sensing element and the other circuits can be integrated upon a common substrate, for example, a semiconductor substrate. In some embodiments, the magnetic field sensor can also include a lead frame and packaging.

Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

Various parameters characterize the performance of magnetic field sensors and magnetic field sensing elements. With regard to magnetic field sensing elements, the parameters include sensitivity, which is the change in the output signal of a magnetic field sensing element in response to a magnetic field, and linearity, which is the degree to which the output signal of a magnetic field sensor varies linearly (i.e., in direct proportion) to the magnetic field. The parameters also include offset, which describes and output from the magnetic field sensing element that is not indicative of zero magnetic field when the magnetic field sensor experiences a zero magnetic field.

GMR and TMR elements are known to have a relatively high sensitivity, compared, for example, to Hall effect elements. Thus, a current sensor that uses GMR or TMR elements can sense smaller currents than can a current sensor that uses Hall effect elements.

Conventional current sensors are also known to be undesirably responsive to external stray magnetic fields.

TMR elements are known to have a higher sensitivity than GMR elements, but at the expense of higher noise at low frequencies.

Also, it is known that some GMR and TMR elements tend to have an undesirable offset voltage, the offset voltage sensitivity changing with temperature. Also, it is known that some GMR and TMR elements tend to change behavior, e.g., offset voltage, after high temperature operation or storage. The offset voltage and changes of offset voltage can cause a current sensor that uses a GMR or TMR element to indicate a wrong current.

Thus, it would be desirable to provide a current sensor that uses GMR or TMR elements, which provides a reduced effect of offset voltages, provides a reduced effect of changes of offset voltage, which provides a reduced impact of external stray magnetic fields, and which can effectively use TMR elements to obtain a higher sensitivity to currents.

SUMMARY

The present invention provides a current sensor that uses GMR or TMR elements, and which provides a reduced effect of offset voltages, provides a reduced effect of changes of offset voltage, which provides a reduced impact of external stray magnetic fields, and which can effectively use TMR elements to obtain a higher sensitivity to currents.

In accordance with an example useful for understanding an aspect of the present invention, a magnetic field sensor can include:
  a substrate;
  a first magnetoresistance element disposed over the substrate, comprising:
    a first maximum response axis;
    a first bias layer structure configured to generate a first bias magnetic field with a first magnetic direction between ninety degrees and sixty degrees relative to the first maximum response axis;
    a first electrical contact coupled to a bottom of the first magnetoresistance element; and
    a second electric contact coupled to a top of the first magnetoresistance element, and the magnetic field sensor can further include:
  a second magnetoresistance element disposed over the substrate, comprising:

a second maximum response axis parallel to the first maximum response axis;

a second bias layer structure configured to generate a second bias magnetic field with a second magnetic direction parallel to the first magnetic direction and opposed to the first magnetic direction;

a third electrical contact coupled to a bottom of the second magnetoresistance element; and a fourth electric contact coupled to a top of the second magnetoresistance element.

In accordance with another example useful for understanding another aspect of the present invention, a method of measuring a magnetic field with a magnetic field sensor can include generating a first AC magnetic field experienced by a first magnetoresistance element, comprising:

a first maximum response axis;

a first bias layer structure configured to generate a first bias magnetic field with a first magnetic direction between ninety degrees and sixty degrees relative to the first maximum response axis;

a first electrical contact coupled to a bottom of the first magnetoresistance element; and a second electric contact coupled to a top of the first magnetoresistance element, and experienced by a second magnetoresistance element, comprising:

a second maximum response axis parallel to the first maximum response axis;

a second bias layer structure configured to generate a second bias magnetic field with a second magnetic direction parallel to the first magnetic direction and opposed to the first magnetic direction;

a third electrical contact coupled to a bottom of the second magnetoresistance element; and a fourth electric contact coupled to a top of the second magnetoresistance element, wherein the first AC magnetic field is parallel to the first and second maximum response axes.

In accordance with another example useful for understanding another aspect of the present invention, a magnetic field sensor can include a substrate;

means for generating a first AC magnetic field experienced by a first magnetoresistance element disposed over the substrate, comprising:

a first maximum response axis;

a first bias layer structure configured to generate a first bias magnetic field with a first magnetic direction between ninety degrees and sixty degrees relative to the first maximum response axis;

a first electrical contact coupled to a bottom of the first magnetoresistance element; and a second electric contact coupled to a top of the first magnetoresistance element, and experienced by a second magnetoresistance element disposed over the substrate, comprising:

a second maximum response axis parallel to the first maximum response axis;

a second bias layer structure configured to generate a second bias magnetic field with a second magnetic direction parallel to the first magnetic direction and opposed to the first magnetic direction;

a third electrical contact coupled to a bottom of the second magnetoresistance element; and a fourth electric contact coupled to a top of the second magnetoresistance element, wherein the first AC magnetic field is parallel to the first and second maximum response axes.

BRIEF DESCRIPTION OF THE DRAWINGS

The foregoing features of the invention, as well as the invention itself may be more fully understood from the following detailed description of the drawings, in which:

FIG. 1 is a block diagram showing four TMR elements, each with a plurality of TMR pillars, proximate to a current conductor;

FIG. 2 is a block diagram showing one TMR pillar, two coils, and magnetic field directions associated with the two coils;

FIG. 8 is a graph showing a variety of signals that can be generated by a current sensor having the arrangement of FIGS. 5-7;

FIG. 17 is a schematic diagram showing the eight TMR or GMR elements of FIG. 16 arranged as two full bridge circuits to generate two difference signals;

DETAILED DESCRIPTION

Figure 3:
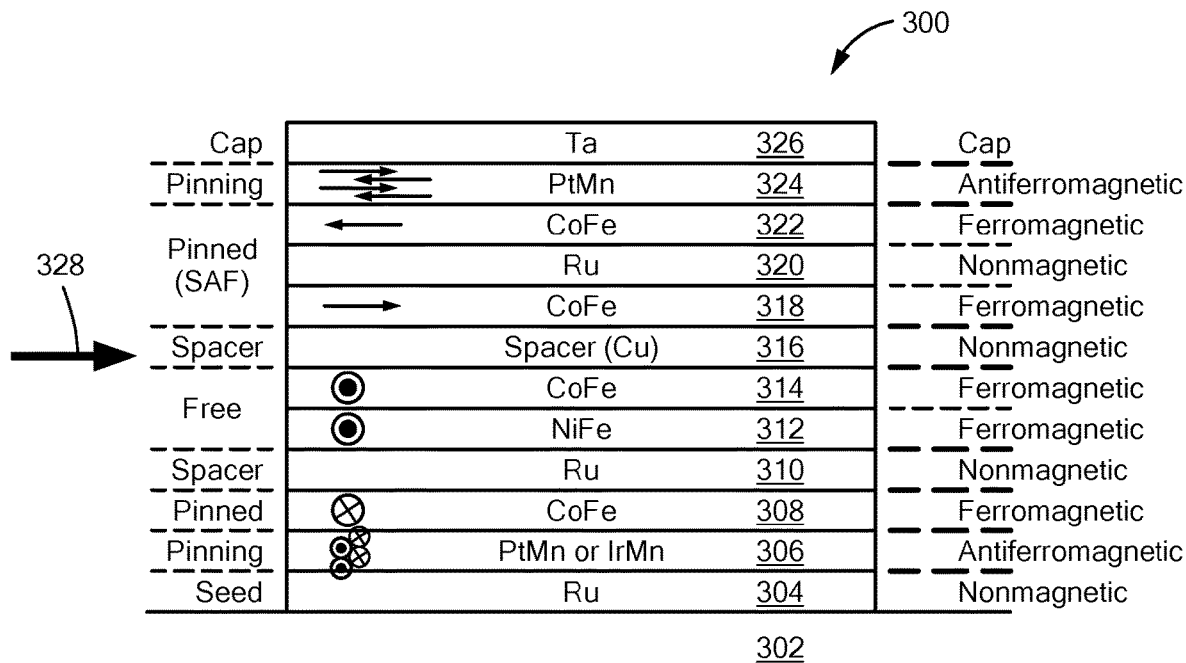
FIG. 3 is a block diagram showing an illustrative GMR element having layers.

Before describing the present invention, it should be noted that reference is sometimes made herein to GMR or TMR elements having particular shapes (e.g., yoke shaped or pillar shaped). One of ordinary skill in the art will appreciate, however, that the techniques described herein are applicable to a variety of sizes and shapes.

As used herein, the term "anisotropy" or "anisotropic" refer to a material that has different properties according to direction in the material. A magnetoresistance element can have a particular axis or direction to which the magnetization of a ferromagnetic or ferrimagnetic layer tends to orientate when it does not experience an additional, external, magnetic field. An axial anisotropy can be created by a crystalline effect or by a shape anisotropy, both of which can allow two equivalent directions of magnetic fields. A directional anisotropy can also be created in an adjacent layer, for example, by an antiferromagnetic layer, which allows only a single magnetic field direction along a specific axis in the adjacent layer.

In view of the above, it will be understood that introduction of an anisotropy in a magnetic layer results in forcing the magnetization of the magnetic layer to be parallel to that anisotropy in the absence of an external field. In the case of a GMR or TMR element, a directional anisotropy provides an ability to obtain a coherent rotation of the magnetization in a magnetic layer in response, for example, to an external magnetic field, which has the property of suppressing the hysteresis behavior of the corresponding element.

As described above, as used herein, the term "magnetic field sensing element" is used to describe a variety of different types of electronic elements that can sense a magnetic field. A magnetoresistance element is but one type of magnetic field sensing element.

As is known, there are different types of magnetoresistance elements, for example, a semiconductor magnetoresistance element such as a giant magnetoresistance (GMR) element and a tunneling magnetoresistance (TMR) element, also called a magnetic tunnel junction (MTJ) element.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet, and a magnetic field sensor that senses a magnetic field density of a magnetic field.

The terms "parallel" and "perpendicular" may be used in various contexts herein. It should be understood that the terms parallel and perpendicular do not require exact perpendicularity or exact parallelism, but instead it is intended that normal manufacturing tolerances apply, which tolerances depend upon the context in which the terms are used. In some instances, the term "substantially" is used to modify the terms "parallel" or "perpendicular." In general, use of the terms "substantially" and the term "about" reflect angles that are within manufacturing tolerances, for example, within +/−ten degrees.

Structures and methods described herein apply to both GMR and TMR magnetoresistance elements, but, only TMR elements are used in examples herein. However, it should be appreciated that the same or similar structures and methods can apply to other spin electronics magnetoresistance elements, either now known or later discovered. This includes, in particular, oxide based spin electronics structures.

Referring to FIG. 1, a structure 100, which can be part of a current sensor described below in conjunction with FIG. 5, can include a current conductor 102. The current conductor can be formed as an open loop for which current travels in two different directions. The structure 100 can also include four TMR elements 104, 106, 108, 110. Each TMR element can be comprised of a plurality of so-called "pillars." Four pillars are shown for each one of the TMR elements 104, 106, 108, 110. However, in other embodiments each TMR element can include a different number of pillars, fewer than or greater than four pillars. In some embodiments, each TMR element has approximately thirty pillars.

Referring now to FIG. 2, shown under the TMR elements 104, 106, 108, 110 of FIG. 1, the structure 100 can include four coils, here expanded as two coils 206, 208.

A pillar 200 can be the same as or similar to one of the pillars of the TMR elements 104, 106, 108, 110. It should be understood that the coil 206 can generate a magnetic field with the direction indicated by an arrow 202, and the coil 208 can generate a magnetic field with a direction indicated by an arrow 204. The coils and the magnetic directions are described more fully in figures below.

Figure 3A:
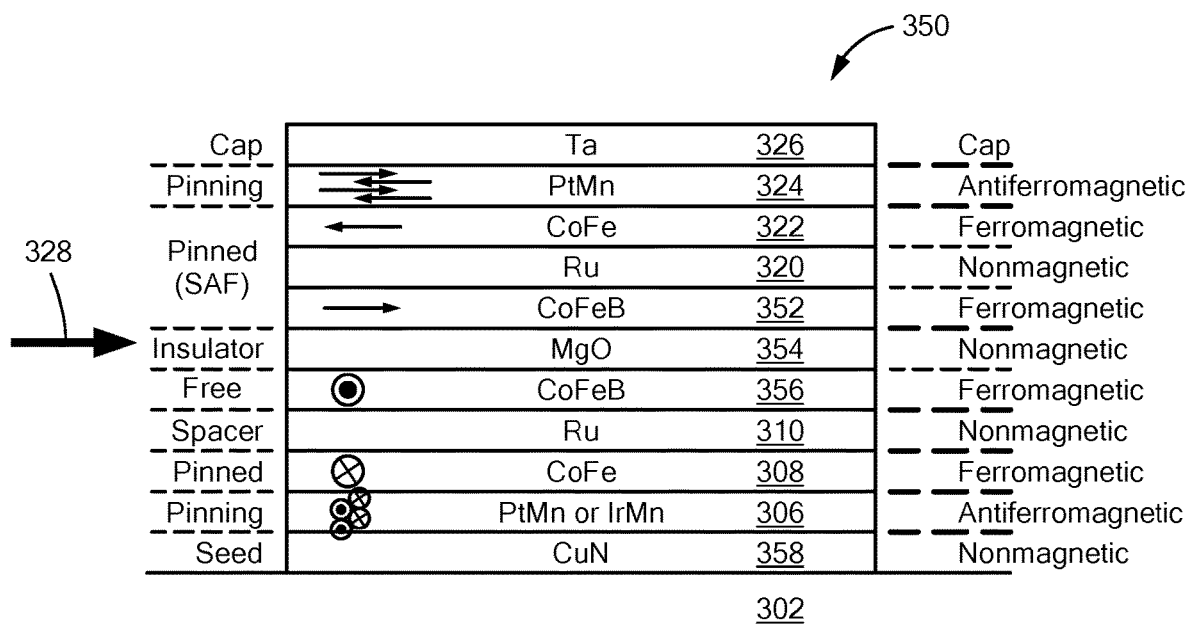
FIG. 3A is a block diagram showing an illustrative TMR element having layers.

FIGS. 3 and 3A describe illustrative GMR and TMR elements, respectively. It will be understood that TMR elements are used in various descriptions herein. However, GMR elements can be used in place of the TMR elements.

Referring now to FIG. 3, an illustrative double pinned GMR element 300 can be comprised of a stack of layers 304-326 disposed upon a surface of a substrate 302.

It will be understood that driving current can run across the layers of a GMR stack of layers, i.e., parallel to the surface of the substrate 302. However, in some embodiments, the driving current can run through the layers in a direction perpendicular to the substrate 302. The GMR element 300 can have a maximum response axis that is parallel to the surface of the substrate and that is in a direction 328 perpendicular to zero field magnetic directions of the free layers 312, 314, and also parallel to the field generated by the reference layers, most notable the pinned layer 318.

The GMR element 300 is double pinned, i.e., it has two pinning layers 306, 324. A synthetic antiferromagnet (SAF) pinned layer structure 318, 320, 322 is magnetically coupled to the pinning layer 324. The layers 324, 322, 320, 318 are collectively referring to as reference layers. The single layer pinned layer 308 is magnetically coupled to the pinning layer 306. The layers 306, 308 are collectively referred to bias layers. At zero external magnetic field, the free layers 312, 314 take on a magnetic alignment parallel to the bias layers 306, 308, with direction (ferromagnetic or antiferromagnetic coupling) determined by thickness and material of the spacer layer 310.

Single pinned arrangements are also possible with one pinning layers and one pinned layer. Advantages of double pinned versus double pinned arrangement are known.

In some embodiments, the single layer pinned layer 308 is replaced by another SAF structure. In still other embodiments, the SAF structure 318, 320, 322 is replaced by a single layer pinned layer.

As described above, in general, the GMR element 300 has a maximum response axis (maximum response to external fields) aligned with the arrow 328, i.e., perpendicular to bias directions experienced by the free layers 312, 314, and parallel to magnetic fields of the reference layers, notably pinned layer 318. Also, in general, it is rotations of the magnetic direction of the free layers 312, 314, caused by external magnetic fields that result in changes of resistance of the GMR stack 300.

A conventional current sensor may directly sense magnetic fields that are in the direction of the arrow 328, which are generated by sensed currents (which are not the above mentioned-currents that drive the GMR element 300). However, it will become apparent from discussion below that, for embodiments herein, the sensed current generates external magnetic fields either into or out of the page, i.e., parallel to magnetic fields of the pinned layers 312, 314 and parallel to magnetic fields of the bias layers 306, 308. Magnetic fields in these directions due to sensed current (i.e., external magnetic fields) tend to increase or decrease a sensitivity of the GMR element 300, sensitivity along the direction 328. Essentially, the external magnetic fields parallel to the magnetic fields of the bias layers 306, 308 tend to add to or subtract from fields in this direction experience by the free layers 312, 314. It will become apparent that the sensitivity shift is sensed by circuits and techniques herein, and thus, it is the sensitivity shift that represents the sensed current.

Referring now to FIG. 3A, in which like elements of FIG. 3 are shown having like reference designations, an illustrative TMR element 350 can have a stack 350 of layers 358, 306-310, 356, 354, 352, 320-326 indicative of one pillar of a multi-pillar TMR element.

It will be understood that a driving current running through the TMR element 350 runs through all of the layers of the stack, running between seed and cap layers 358 and 326, i.e., perpendicular to a surface of the substrate 302. The TMR element 350 can have a maximum response axis that is parallel to the surface of the substrate and that is in the direction 328 perpendicular to zero field magnetic directions of the free layer 356, and also parallel to the bias field generated by the reference layers, most notably in the pinned layer 352.

The TMR element 350 is double pinned, i.e., it has two pinning layers 306, 324. A synthetic antiferromagnet (SAF) pinned layer structure 352, 320, 322 is magnetically coupled to the pinning layer 324. The layers 324, 322, 320, 352 are collectively referring to as reference layers. The single layer pinned layer 308 is magnetically coupled to the pinning layer 306. The layers 306, 308 are collectively referred to as bias layers. With zero external magnetic field, the free layer 356 takes on a magnetic alignment parallel to the bias layers 306, 308, with direction (ferromagnetic or antiferromagnetic coupling) determined by thickness and material of the spacer layer 310.

In some embodiments, the single layer pinned layer 308 is replaced by another SAF structure. In still other embodiments, the SAF structure 352, 320, 322 is replaced by a single layer pinned layer.

As described above, in general, the TMR element 350 has a maximum response axis (maximum response to external fields) aligned with the arrow 328, i.e., perpendicular to bias directions experienced by the free layer 356, and parallel to magnetic fields of the reference layers, notably pinned layers 352. Also, in general, it is rotations of the magnetic direction of the free layer 356 caused by external magnetic fields that result in changes of resistance of the TMR element 350.

A conventional current sensor may directly sense magnetic fields that are in the direction of the arrow 328, which are generated by sensed currents (which are not the above mentioned-currents that drive the TMR element 350). However, it will become apparent from discussion below that, for embodiments herein, the sensed current generates external magnetic fields either into or out of the page, i.e., parallel to magnetic fields of the free layer 356 and parallel to magnetic fields of the bias layers 306, 308. Magnetic fields in these directions due to sensed current (i.e., external magnetic field) tend to increase or decrease a sensitivity of the TMR element 300, sensitivity along the direction 328. Essentially, the external magnetic fields parallel to the magnetic fields of the bias layers 306, 308 tend to add to or subtract from fields in this direction experience by the free layer 356. It will become apparent that the sensitivity shift is sensed by circuits and techniques herein, and thus, it is the sensitivity shift that represents the sensed current.

Figure 4:
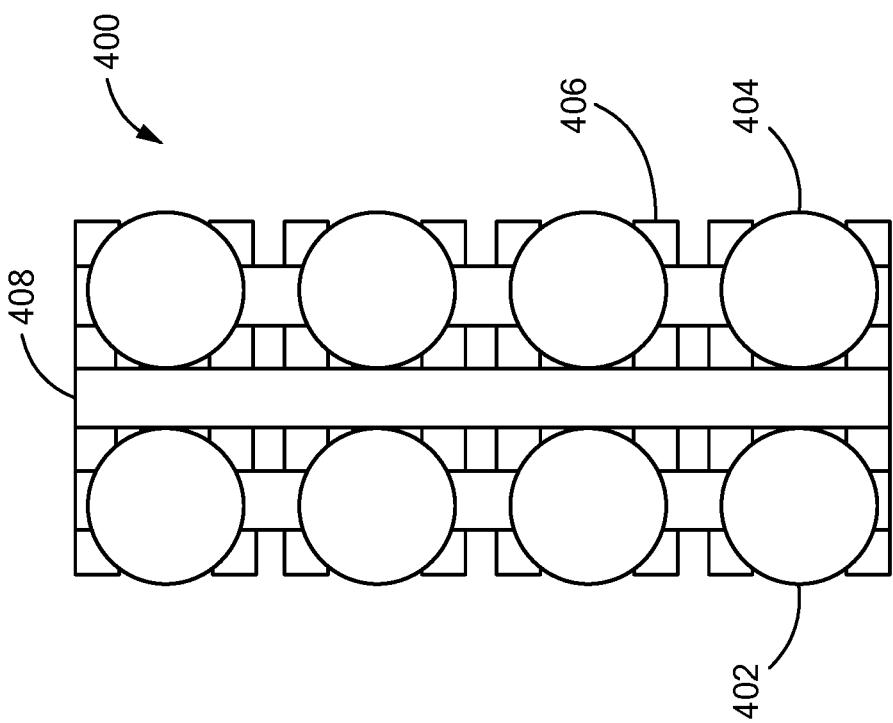
FIG. 4 is a block diagram showing an expanded view of two of the four TMR elements of FIG. 1 and showing positions of the two coils of FIG. 2.

Referring to FIG. 4, illustrative TMR elements 400 include a first TMR element 402 and a second TMR element 404. Each one of the TMR elements includes a respective four TMR pillars that extend upward from a surface of a substrate on which the TMR elements 402, 404 are formed. As described above, a TMR element can have more than four or fewer than four pillars. The TMR elements 400 are the same as TMR elements 104, 106 or TMR elements 108, 110 of FIG. 1, but here shown in expanded form to better show the coils 406, 408, which can be the same as or similar to the coils 208, 206 of FIG. 2.

In non-feedback arrangements, the feedback coils 408 are not formed.

It will be understood that, when an AC current is applied to the perturbing coil 406, a perturbing magnetic field is generated in a direction parallel to the page and oriented between top and bottom on the page. In contrast, when an AC or DC current is applied to the feedback coil 408, a feedback magnetic field is generated in a direction parallel to the page and oriented between right and left on the page.

Referring again briefly to FIG. 3A, the TMR element 350 is shown in side view, but the TMR elements 402, 404 are shown in top view. The TMR element pillars are oriented such that the maximum response axis 328 is parallel to the perturbing magnetic fields generated by the perturbing coil 406, i.e., between right and left on the page of FIG. 3A but between top and bottom on the page of FIG. 4. Accordingly, the TMR element pillars can be oriented such that the maximum response axis 328 is perpendicular to the current conductor (external) magnetic fields generated by the sensed currents 501 of FIG. 5. Also, the TMR element pillars can be oriented such that magnetic directions of the reference layers of the TMR element 350 are perpendicular to the current conductor magnetic fields generated by the sensed currents.

With this orientation of the TMR element pillars, the TMR element pillars are also oriented such that a direction of bias magnetic fields in the bias layers 306, 308 is parallel to a feedback magnetic field generated by the feedback coil 408, i.e., into and out of the page on FIG. 3A, but between right and left on the page of FIG. 4, which is also parallel to, but opposing, sensed magnetic fields generated by the sensed current.

Referring again briefly to FIG. 4, when feedback is used, fields generated by the feedback coil 408 are used to oppose (and are parallel to) fields resulting from sensed current in the current conductor 102 of FIG. 1, which are also parallel to fields in the bias layers 306, 308 of FIG. 3A.

From the above, it should be understood that, for a circuit with no feedback and no feedback coils 408, sensed magnetic fields resulting from sensed currents result in sensitivity shifts of the TMR elements 400 and the sensed magnetic fields are not directly sensed. For a circuit with feedback, the feedback coil 408 can generate a feedback magnetic field that fully opposes the sensed magnetic field generated by the sensed currents in a current conductor. The feedback coil arrangement can result in no sensitivity shift at the TMR elements 400. However, current in the feedback coil 408 can be indicative of a sensitivity shift that would have occurred were it not for the feedback arrangement and the feedback coil 408. The current in the feedback coils can be indicative of the sensitivity shift that would have occurred.

Examples of circuits with and without feedback are described in conjunction with figures below. Advantages of feedback arrangements include, but are not limited to, and ability to keep the TMR or GMR element operating at a near zero magnetic field, i.e., within a linear region of a transfer characteristic of the TMR or GMR element. Thus, nonlinearity of the measurement of the sensed magnetic field and sensed current can be greatly reduced versus a non-feedback arrangement.

Advantages of using the sensitivity shifts as that which are sensed by the sensed current and resulting sensed magnetic field are described in conjunction with figures below.

Figure 5:
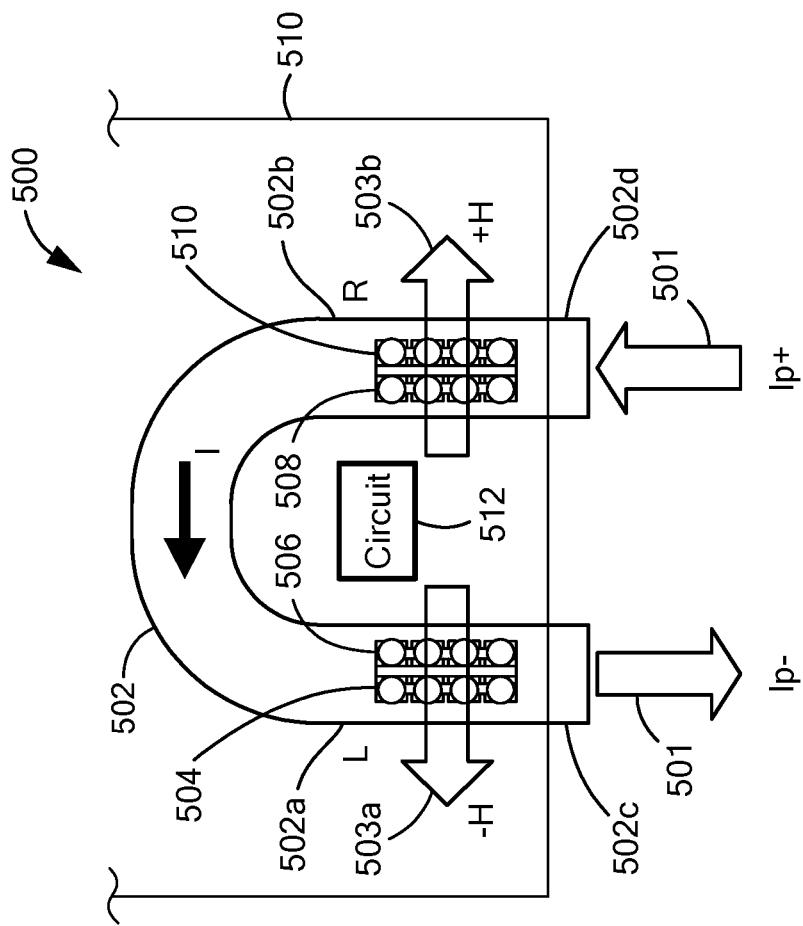
FIG. 5 is a block diagram showing a current sensor having the four TMR elements and the current conductor of FIG. 1, and also showing a substrate proximate to the current conductor.

Referring now to FIG. 5, a magnetic field sensor 500 can include four TMR elements 504, 506, 508, 510 disposed upon a substrate 510 along with an electronic circuit 512.

The magnetic field sensor can also include a current conductor 502 through which a sensed current 501, Ip+, Ip− that the magnetic field sensor 500 is operable to measure, can flow. To avoid confusion herein, the sensed current 501 is described herein to be a DC sensed current. However, the same techniques apply to an AC measure current.

As indicated, because the current conductor 502 is an open loop, the current 501 flows in two different directions Ip−, Ip+. The current conductor 502 has two current conductor portions 502a, 502b. Thus, the current 501 results in two different direction magnetic fields represented by arrows 503a, 503b.

It should be understood from discussion above that maximum response axes of the four TMR element 504, 506, 508, 510 are parallel to the long axis of the TMR elements, i.e., between top and bottom of the page, and are all in the same direction. Along this same axis, perturbing magnetic fields generated by perturbing coils, e.g., 406 of FIG. 4, are generated.

Also, the fields in the bias layers e.g., 306, 308 of FIG. 3A, are aligned between right and left on the page of FIG. 5 and all have the same direction. Thus, the sensed current magnetic fields 503a, 503b are aligned with the bias magnetic fields (between right and left) and not with the maximum response axis (between top and bottom). Since the sensed magnetic fields 503a, 503b are in opposite directions, sensitivity of two of the TMR elements, e.g., 504, 506, moves in one direction, e.g., increases, and sensitivity of the other two TMR elements, e.g., 508, 510, moves in the other direction, e.g., decreases.

In some embodiments, the current conductor 502 can be part of a lead frame of the magnetic field sensor 500, which can terminate at two of a plurality of leads in the lead frame. In other embodiments, the current conductor 502 is not part of the magnetic field sensor, but is instead a separate conductor, for example, a current conductor on a circuit board to which the magnetic field sensor 500 is mounted.

The TMR elements 504, 506 are labeled as left, L, and the TMR elements 508, 510 are labeled right, R. The left and right designations are arbitrary, and are used to indicate that the TMR elements 504, 506 experience the magnetic field 503a that is in a different direction from the magnetic field 503b experience by the TMR elements 508, 510. However, for convenience, left and right also indicate left and right sides of FIG. 5. The different directions result from the two different directions in which the sensed current 501 flows in the current conductor 502.

While the four TMR elements 504, 506, 508, 510 are shown, in other embodiments, there can be two TMR elements, one disposed on the left and one disposed on the right. In other embodiments, there can be more than four TMR elements, with half on the left and half on the right.

Figure 6:
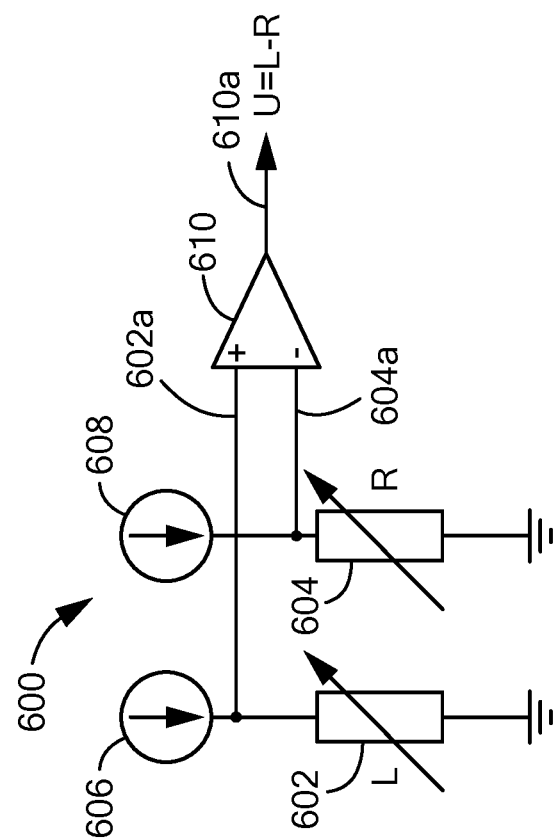
FIG. 6 is a schematic diagram showing two TMR elements or two GMR elements coupled to a differential amplifier to generate a difference signal.

Referring now to FIG. 6, an electronic circuit 600, used in illustrative magnetic field sensors described in conjunction with figures below, can include first and second magnetoresistance elements 602, 604, e.g., TMR elements. The magnetoresistance element 602 can receive a driving current from a current source 606. The magnetoresistance element 604 can receive a driving current from a current source 608.

Voltages 602a, 604a are generated by the first and second magnetoresistance elements 602, 604, respectively, which are responsive to magnetic fields.

A differential amplifier 610 is coupled to the first and second magnetoresistance elements 602, 604. The differential amplifier 610 is operable to generate a voltage 610a that is a difference (U=L−R) of the voltages 602a, 604a. Reasons for the difference are described in conjunction with figures below.

It should be understood that circuits described in conjunction with figures below can instead generate a difference R-L, with minor modifications.

Figure 7:
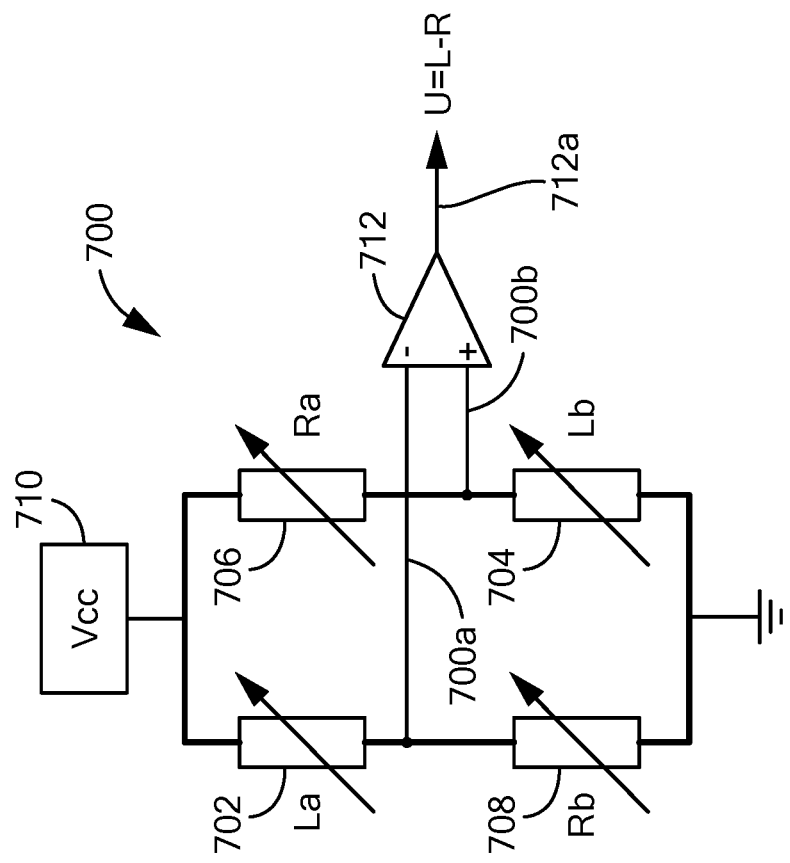
FIG. 7 is a schematic diagram showing four TMR elements or four GMR elements coupled in a bridge arrangement to generate a difference signal.

Referring now to FIG. 7, an electronic circuit 700, used in illustrative magnetic field sensors described in conjunction with figures below, can include first, second, third, and fourth magnetoresistance elements 702, 704, 706, 708, e.g., TMR elements arranged in a full bridge arrangement. The full bridge arrangement can be coupled between a voltage source 710 and a reference voltage, e.g., a ground voltage.

Voltages 700a, 700b are generated by the full bridge, both of which are responsive to magnetic fields. A difference between the voltages 700a, 700b is automatically generated by the full bridge arrangement.

A differential amplifier 712 can be coupled to the full bridge arrangement. The differential amplifier 712 is operable to generate a difference signal 712a that is also a difference of the voltages 700a, 700b. Reasons for the difference are described in conjunction with figures below.

Referring now to FIG. 8, graphs 800 have vertical ranges in amplitude, for example, volts in arbitrary units, and horizontal ranges in time in arbitrary units.

For clarity, the graphs 800 use sensed currents, e.g., the sensed current 501 of FIG. 5, as being DC currents, in particular, I=0, I>0, and I<0. However, here and in circuits described below, it will be understood that the sensed currents can be AC currents.

Graph 802 is indicative of an AC signal 802a generated by the left magnetoresistance element(s), e.g., one of, or both of, the magnetoresistance elements 504, 506 of FIG. 5, when the sensed current, e.g., 501 of FIG. 5, is zero. The AC part of the signal is a result of the perturbing magnetic field described above in conjunction with FIG. 4, generated by the coil 406, which, as described above, can be aligned with a maximum response axis of the left magnetoresistance element(s). The perturbing magnetic field can have a constant amplitude. In some embodiments, the perturbing magnetic field, and the resulting AC signal 802a can have a high frequency, e.g., one megaHertz.

Graph 804 is indicative of an AC signal 804a generated by the right magnetoresistance element(s), e.g., one of or both of the magnetoresistance elements 508, 510 of FIG. 5, when the sensed current, e.g., 501 of FIG. 5, is zero. The AC part of the signal is a result of the perturbing magnetic field also described above in conjunction with FIG. 4, generated by the coil 406, which, as described above, can be aligned with a maximum response axis of the right magnetoresistance element(s).

Graph 806 shows a signal 806a indicative of a difference between the AC signals 802a, 804a. Thus, for a zero sensed current, I, the difference is the signal 806a with an AC amplitude of zero.

Graph 808 is indicative of an AC signal 808a generated by the left magnetoresistance element(s), e.g., one of or both of the magnetoresistance elements 504, 506 of FIG. 5, in response to the perturbing magnetic field(s) generated by the perturbing coils(s), when the sensed current, e.g., 501 of FIG. 5, is greater than zero. The AC part of the signal 808a is a result of the perturbing magnetic field described above in conjunction with FIG. 4, generated by perturbing coils proximate to the left magnetoresistance element(s), e.g., 406, which, as described above, can be parallel to a maximum response axis of the left magnetoresistance element(s). The signal 808a is greater in amplitude than the signal 802a due to an effect of the magnetic field generated by the non-zero sensed current, e.g., the magnetic field 503a generated by the measure current 501 of FIG. 5.

As described above in conjunction with FIG. 4, the magnetic field generated by the sensed current, in a direction parallel to magnetic fields in the bias layers 306, 308 of FIG. 4, has the effect of changing a sensitivity of the left magnetoresistance element(s), here shown to be an increase of sensitivity. Thus, the magnetic field generated by the sensed current 501 has an indirect influence upon the signal 808a.

Graph 810 is indicative of an AC signal 810a generated by the right magnetoresistance element(s), e.g., one of or both of the magnetoresistance elements 508, 510 of FIG. 5, in response to the perturbing magnetic field(s) generated by the perturbing coils(s), when the sensed current, e.g., 501 of FIG. 5, is greater than zero. The AC part of the signal 810a is a result of the perturbing magnetic field described above in conjunction with FIG. 4, generated by perturbing coils proximate to the right magnetoresistance element(s), e.g., 406, which, as described above, can be parallel to a maximum response axis of the right magnetoresistance element(s). The signal 810a is lower in amplitude than the signal 804a due to an effect of the magnetic field generated by the non-zero sensed current, e.g., the magnetic field 503b generated by the sensed current 501 of FIG. 5, and which is in a direction opposite to the magnetic field 503a.

As described above in conjunction with FIG. 4, the magnetic field generated by the sensed current, in a direction parallel to magnetic fields in the bias layers 306, 308 of FIG. 4, has the effect of changing a sensitivity of the left magnetoresistance element(s), here shown to be a decrease of sensitivity. Thus, the magnetic field generated by the sensed current 501 has an indirect influence upon the signal 810a.

Graph 812 shows a signal 812a indicative of a difference between the AC signals 808a, 810a. Thus, for a sensed current, I, greater than zero, the difference is the signal 812a with a non-zero AC amplitude. Amplitude of the signal 812a is indicative of an amplitude of the sensed current 501. Phase of the signal 812a is indicative of a direction of the sensed current 501.

Graph 814 is indicative of an AC signal 814a generated by the left magnetoresistance element(s), e.g., one of or both of the magnetoresistance elements 504, 506 of FIG. 5, in response to the perturbing magnetic field(s) generated by the perturbing coils(s), when the sensed current, e.g., 501 of FIG. 5, is less than zero. The AC part of the signal 814a is a result of the perturbing magnetic field described above in conjunction with FIG. 4, generated by perturbing coils proximate to the left magnetoresistance element(s), e.g., 406, which, as described above, can be parallel to a maximum response axis of the left magnetoresistance element(s). The signal 814a is smaller in amplitude than the signal 802a due to an effect of the magnetic field generated by the non-zero sensed current, e.g., the magnetic field 503a generated by the measure current 501 of FIG. 5, but now reversed versus field 503b.

As described above in conjunction with FIG. 4, the magnetic field generated by the sensed current, in a direction parallel to magnetic fields in the bias layers 306, 308 of FIG. 4. has the effect of changing a sensitivity of the left magnetoresistance element(s), here shown to be a decrease of sensitivity. Thus, the magnetic field generated by the sensed current 501 has an indirect influence upon the signal 814a.

Graph 816 is indicative of an AC signal 816a generated by the right magnetoresistance element(s), e.g., one of or both of the magnetoresistance elements 508, 510 of FIG. 5, in response to the perturbing magnetic field(s) generated by the perturbing coils(s), when the sensed current, e.g., 501 of FIG. 5, is lesser than zero. The AC part of the signal 816a is a result of the perturbing magnetic field described above in conjunction with FIG. 4, generated by perturbing coils proximate to the right magnetoresistance element(s), e.g., 406, which, as described above, can be parallel to a maximum response axis of the right magnetoresistance element(s). The signal 816a is higher in amplitude than the signal 804a due to an effect of the magnetic field generated by the non-zero sensed current, e.g., the magnetic field 503b generated by the sensed current 501 of FIG. 5, and which is in a direction aligned with the magnetic field 503a.

As described above in conjunction with FIG. 4, the magnetic field generated by the sensed current, in a direction parallel to magnetic fields in the bias layers 306, 308 of FIG. 4, has the effect of changing a sensitivity of the left magnetoresistance element(s), here shown to be a decrease of sensitivity. Thus, the magnetic field generated by the sensed current 501 has an indirect influence upon the signal 814a.

Graph 818 shows a signal 818a indicative of a difference between the AC signals 812a, 812b. Thus, for a sensed current, I, less than zero, the difference is the signal 818a with a non-zero AC amplitude. Amplitude of the signal 818a is indicative of an amplitude of the sensed current 501. Phase of the signal 818a is indicative of a direction of the sensed current 501. The signal 818a (and 816a, 814a) is opposite in phase from (one hundred eighty degrees apart from) the signal 812a, which is indicative of the different directions of the sensed current.

As described above, the graphs 800 are indicative of DC sensed magnetic fields, e.g., 503a, 503b of FIG. 5, generated by a DC current, e.g., 501 of FIG. 5. However, the same techniques apply to AC sensed magnetic fields generated by and AC sensed current. To this end, it will be understood that preferably, the AC sensed current has a frequency or bandwidth less than a frequency of the perturbing magnetic fields, e.g., frequency of the signals in the graphs 800. In some embodiments, the frequency or bandwidth of the AC sensed current is less than one half of the frequency of the perturbing magnetic fields. In some embodiments, the frequency or bandwidth of the AC sensed current is less than one fifth or less than one tenth of the frequency of the perturbing magnetic fields.

Figure 9:
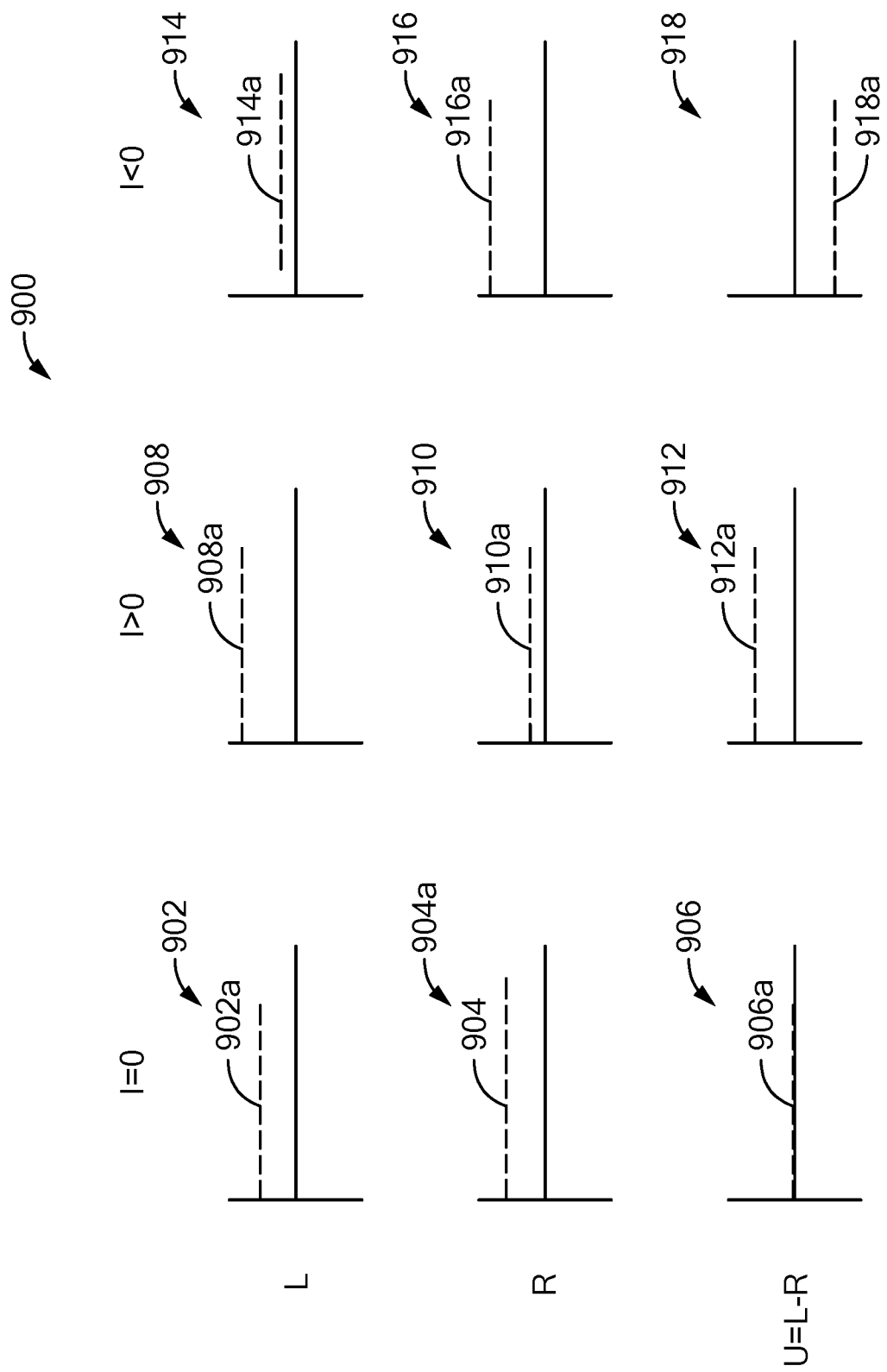
FIG. 9 is a graph showing a variety of signals generated by a current sensor having the arrangement of FIG. 5-7 and having an amplitude detector resulting in amplitudes of the signals of FIG. 8.

Referring now to FIG. 9, and referring back to FIG. 8, graphs 900 show DC signals 902*a*, 904*a*, 906*a*, 908*a*, 910*a*, 912*a*, 914*a*, 916*a*, 918*a* that are indicative of AC amplitudes of the signals 802*a*, 804*a*, 806*a*, 808*a*, 810*a*, 812*a*, 814*a*, 816*a*, 818*a*, respectively. The signal 918*a* is shown as a negative amplitude, which is indicative of the signal 818*a* being one hundred eighty degrees out of phase from the other signals. Compare signals 912*a* and 918*a* and also signals 812*a* and 818*a*. The signal 918*a* with an opposite sign is an outcome of the signal 918*a* being a difference of signals 914*a* and 916*a*.

Reasons for the signals 902*a*, 904*a*, 906*a*, 908*a*, 910*a*, 912*a*, 914*a*, 916*a*, 918*a* indicative of amplitudes will become apparent in figures below that describe amplitude detecting circuits.

Figure 10:
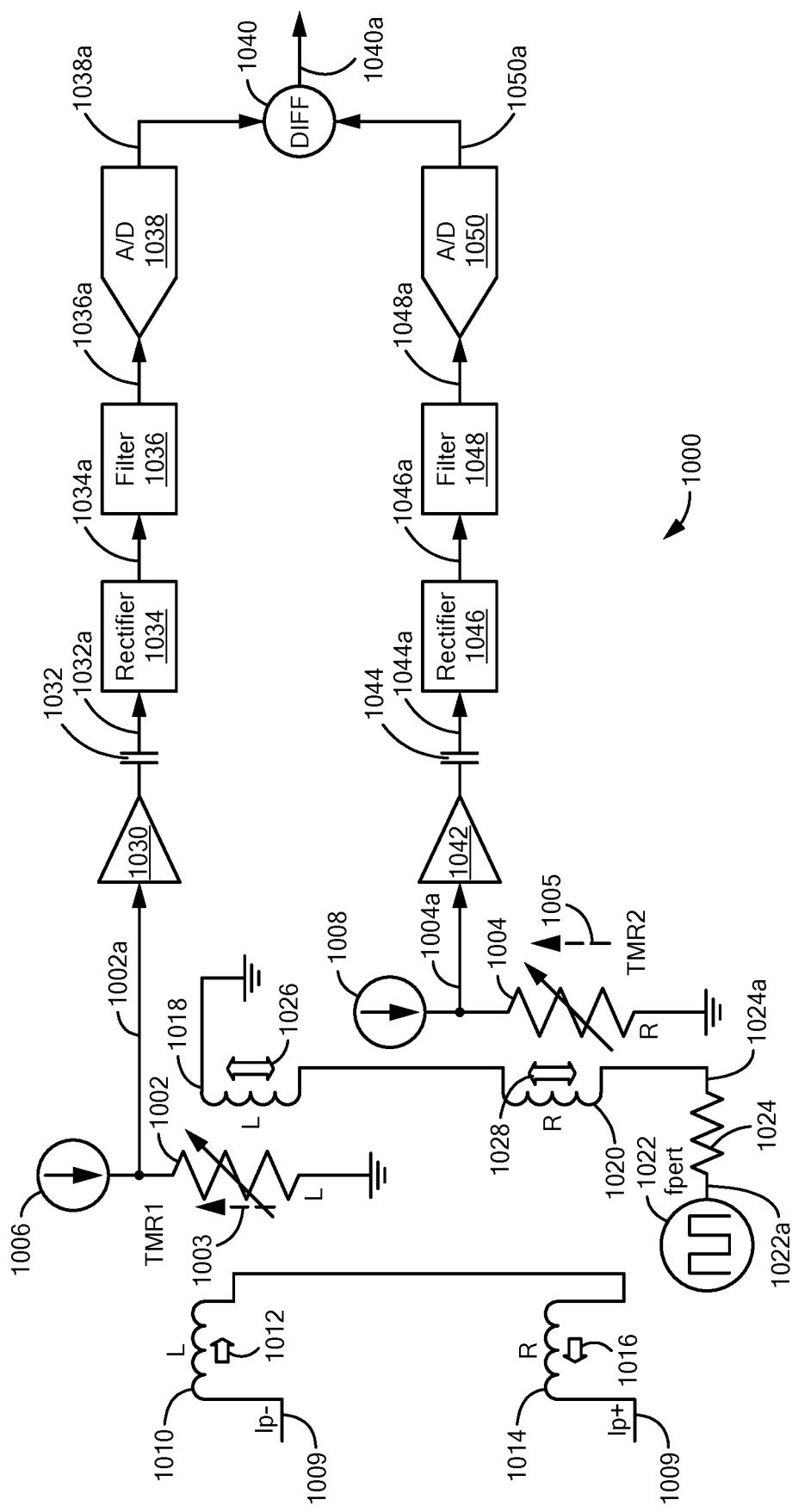
FIG. 10 is a schematic diagram of an illustrative current sensor having two TMR or GMR elements and two amplitude detector circuits and with a non-feedback arrangement.

Referring now to FIG. 10, an illustrative magnetic field sensor 1000 can include first and second magnetoresistance elements 1002, 1004, respectively, which are also designated left, L, and right, R, magnetoresistance elements, which can indicate left and right sides of FIG. 5.

The first magnetoresistance element 1002 can be the same as or similar to the magnetoresistance element 602 of FIG. 6. The second magnetoresistance element 1004 can be the same as or similar to the magnetoresistance element 604 of FIG. 6.

The first magnetoresistance element 1002 is coupled to receive a driving current from current source 1006. The second magnetoresistance element 1004 is coupled to receive a driving current from a current source 1008. A voltage signal 1002*a* is generated by the first magnetoresistance element 1002. A voltage signal 1004*a* is generated by the second magnetoresistance element 1004.

The first magnetoresistance element 1002 has a maximum response axis for which the direction is indicated by an arrow 1003. The second magnetoresistance element 1004 has a maximum response axis for which the direction is indicated by an arrow 1005.

A first perturbing coil 1018 is disposed proximate to the first magnetoresistance element 1002. A second perturbing coil 1020 is disposed proximate to the second magnetoresistance element 1004. The first and second perturbing coils 1018, 1020 can be coupled in series.

A clock generator 1022 can be operable to generate a clock voltage signal 1022*a* coupled to a resistor 1024. A current signal 1024*a* is generated as an end of the resistor 1024.

In response to the current signal 1024*a*, the first perturbing coil 1018 generates an AC magnetic field with directions indicated by an arrow 1026. Also in response to the current signal 1024*a*, the second perturbing coil 1020 generates an AC magnetic field with directions indicated by an arrow 1028. The directions 1026 of magnetic fields generated by the first perturbing coil 1018 are parallel to the maximum response axis 1003 of the first magnetoresistance element 1002. The directions 1028 of magnetic fields generated by the second perturbing coil 1020 are parallel to the maximum response axis 1005 of the second magnetoresistance element 1004. Thus, the first magnetoresistance element 1002 and the second magnetoresistance element 1004 are directly responsive to magnetic fields generated by the first perturbing coil 1018 and by the second and perturbing coil 1020, respectively. Thus, the first and second voltage signals 1002*a*, 1004*a* can be AC voltage signals, each with a frequency equal to a frequency of the clock signal 1022*a*.

The magnetic field sensor 1000 may or may not include a current conductor see, e.g., coils 1010, 1014), for example the current conductor 501 of FIG. 5. In some embodiments, it should be understood from discussion above that the current conductor can be a conductor inside of the magnetic field sensor 1000 and, in other embodiments, the current conductor can be a conductor inside of the magnetic field sensor 1000.

The current conductor is indicated in part by a first sensed current coil 1010 indicative of a first portion of, for example, a left side of, a sensed current conductor, for example, the left side of the sensed current conductor 501 of FIG. 5. The sensed current conductor is also indicated in part by a second sensed current coil 1014 indicative of a second portion of, for example, a right side of, the sensed the current conductor, for example, the right side of the sensed current conductor 501 of FIG. 5. However, it will be understood that the sensed current conductor 501 is not coil. The first and second sensed current coils 1010, 1014 are used merely to clarify that magnetic fields are generated by the sensed current conductor 501.

As described above, a sensed current 501 carried by the sensed current conductor 502 of FIG. 5, i.e., a sensed current 1009 carried by the first and second sensed current coils 1010, 1014, are described herein to be DC currents, merely for clarity. Thus, the first sensed current coil 1010 generates a magnetic field with a first direction indicated by arrow 1012, and the second sensed current coil 1014 generates a magnetic field with a second direction indicated by an arrow 1016. The first and second directions 1012, 1016 are in opposite directions from each other.

For reasons described above in conjunction with FIGS. 4 and 5, the magnetic fields with first and second directions 1012, 1016, respectively, result in opposite direction changes of sensitivity of the first magnetoresistance element 1002 and of the second magnetoresistance element 1004. The changes of sensitivity are represented by the graphs 800 of FIG. 8.

An amplifier 1030 is coupled to receive the first voltage signal 1002*a*, which, as described above, can be an AC voltage signal like the signals 802*a*, 808*a*, 814*a* of FIG. 8, having an AC frequency equal to a frequency of the clock signal 1022*a*, and having an amplitude in accordance with an amplitude of the sensed magnetic field having the direction 1012.

Similarly, an amplifier 1042 is coupled to receive the second voltage signal 1004*a*, which, as described above, can be an AC voltage signal like the signals 804*a*, 810*a*, 816*a* of FIG. 8, having an AC frequency equal to a frequency of the clock signal 1022*a*, and having an amplitude in accordance with an amplitude of the sensed magnetic field having the direction 1016.

The amplifier 1030 is operable to generate an amplified signal 1030*a* and the amplifier 1042 is operable to generate and amplified signal 1042*a*.

The amplified signal 1030*a* can be AC coupled with a capacitor 1032 and the amplified signal 1042*a* can be AC coupled with a capacitor 1044, to generate AC coupled signals 1032*a*, 1042*a*.

A rectifier 1034 can be coupled to receive the AC coupled signal 1032a and a rectifier 1046 can be coupled to receive the AC coupled signal 1044a. The rectifier 1034 can be operable to generate a rectified signal 1034a and the rectifier 1046 can be operable to generate a rectified signal 1046a. In some embodiments, the rectifiers 1034, 1046 can be active rectifier circuits using feedback that have little or no voltage drop.

A filter 1036 can be coupled to receive the rectified signal 1034a and a filter 1048 can be coupled to receive the rectified signal 1046a. In some embodiments, the filters 1036, 1048 can be low pass filters.

It will be understood that the rectifier 1034 coupled in series with the filter 1036 forms a first amplitude detection circuit. It will also be understood that the rectifier 1046 series with the filter 1048 points a second amplitude detection circuit. Thus, the filter 1036 is operable to generate an amplitude signal 1036a and the filter 1048 is operable to generate an amplitude signal 1048a.

Referring briefly to FIGS. 8 and 9, it should be understood that the amplitude detecting circuits result in signals in a first two rows of graphs 800 turning into signals in a first two rows of graphs 900.

The magnetic field sensor 1000 can also include an analog-to-digital converter 1038 coupled to receive the amplitude signal 1036a and an analog-to-digital converter 1050 to receive the amplitude signal 1048a. The amplitude to digital converter 1038 is operable to generate a converted signal 1038a and the amplitude to digital converter 1050 is off to generate a converted signal 1050a.

The converted signals 1038a, 1050a can be received by a differencing circuit 1040 operable to generate a difference signal 1040a. Values of the difference signal are directly related to values of the measure current 1009.

The magnetic field sensor 1000, which uses the perturbing magnetic fields with directions 1026, 1028 to indirectly measure the sensed current 1009 has advantages over a conventional magnetic field sensor that directly measures the sensed current 1009. For example, because the capacitors 1032, 1044 can block DC portions of signals to generate the AC coupled signals 1032a, 1044a, any undesirable effects that may result for undesirable DC offset voltages generated by the first and second magnetoresistance elements 1002, 1004 can be eliminated. This is an advantage both for GMR and TMR elements.

In addition, though the magnetic field sensor 1000 can use either TMR elements or GMR elements as the first and second magnetoresistance elements 1002, 1004, the magnetic field sensor 1000 is well suited for use of the TMR elements. It is known that TMR elements tend to have higher sensitivities than GMR elements. It is also known that TMR elements tend to have worse electrical noise and worse signal to noise ratios at low frequencies that GMR elements. Because the magnetic field sensor 1000 actually operates with relatively high frequencies generated by the clock signal generator 1022, the TMR elements, which have higher sensitivity that GMR elements, can avoid the higher noise at low frequencies The same advantages apply to all magnetic field sensors described herein.

Figure 11:
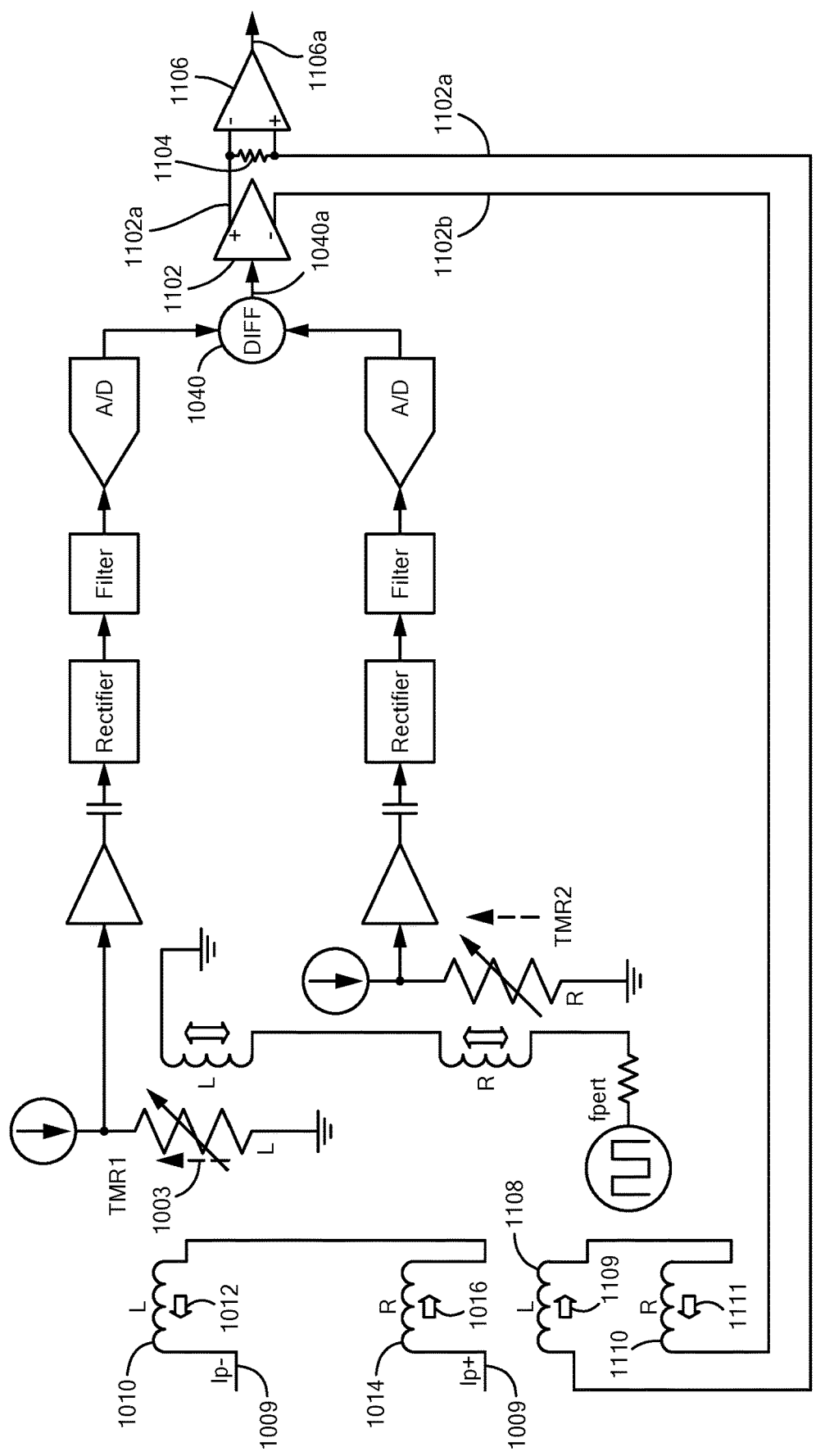
FIG. 11 is a schematic diagram of an illustrative current sensor having two TMR or GMR elements and two amplitude detector circuits and with a feedback arrangement.

It will be understood that the magnetic field sensor 1000 is an open loop magnetic field sensor having no feedback loop from the difference signal 1040a to an earlier point in the magnetic field sensor 1000. FIG. 11 below describes a feedback magnetic field sensor with closed loop feedback.

The amplitude signals 1036a, 1048a are like the signals in the first two rows of the graphs 900 of FIG. 9. The difference signal 1040a is like the signals in the last row of the graph 900 of FIG. 9. Thus, the difference signal 1040a includes information about the amplitude of the sensed current 1009 and the direction of the sensed current 1009. The signal 1040a can be sent outside of the magnetic field sensor 1000 for further processing and interpretation. However, in other embodiments, the signal 1040a can undergo further processing and interpretation by other circuits (not shown) within the magnetic field sensor.

The clock generator 1022 is shown to generate a two state clock signal 1022a. Thus, the current signal 1024a is a two state current signal and the perturbing magnetic fields generated by the first and second perturbing oils 1018, 1020 are two state magnetic fields. Accordingly, the signals 1002a, 1004a are two state signals. This is unlike the AC sinusoid signals of the graphs 100 FIG. 8. However, it will be understood that the same concepts apply to the graphs of FIGS. 8 and 9, but the signals in the graphs 800 of FIG. 8 will be square waves instead of sinusoids.

In some other embodiments, the clocks signal generator 1022 is replaced by a sinewave generator.

The magnetic field sensor 1000, and all magnetic field sensor described herein can provide a variety of advantages over conventional current sensors used to directly sense magnetic fields due to current. For example, DC offsets and offset shifts of the TMR elements has little or no negative influence, because the capacitors 1032, 1044 can block DC signal components.

Effects of any external stray fields are reduced. Effects of stray fields in the direction of the perturbing fields, i.e., in directions perpendicular to directions 503a, 503b of FIG. 5, tend to be canceled by U=L−R calculation. However, stray fields in a direction perpendicular to the perturbing fields, i.e., in directions parallel to directions 503a, 503b of FIG. 5 may be reduced, but by a lesser amount, depending upon a strength of the stray fields. The closed loop mechanism described below in conjunction with FIG. 11 can help to improve the lesser amount of improvement otherwise provided in the effect of stray fields in directions parallel to directions 503a, 503b of FIG. 5.

Referring now to FIG. 11, in which like elements of FIG. 11 are shown having like reference designations, another illustrative magnetic field sensor 1100 can include all of the elements of the magnetic field sensor 1000 of FIG. 10.

The magnetic field sensor 1100 also can include a current driver 1102 coupled to receive the difference signal 1040a and operable to generate differential feedback current signal 1102a, 1102b. A first feedback coil 1108 can be disposed proximate to the first portion of the sensed current conductor 1010. A second feedback coil 1110 can be disposed proximate to the second portion of the sensed current conductor 1014.

The differential feedback current signal 1102a, 1102b can be arranged to generate a first feedback magnetic field that has a direction indicated by an arrow 1109 and to generate a second feedback magnetic field that has a direction indicated by and arrow 1111. The direction 1109 opposes the direction 1012. The direction 1111 opposes the direction 1016. The feedback results in the magnetic fields experienced ty the first and second magnetoresistance elements being approximately zero for all different values of the sensed current 1009.

The magnetic field sensor 1100 can also include a resistor 1104 in series with one side of the differential current signal 1102a, 1102b. A voltage appears across the resistor 1104 with a value in accordance with the differential current signal 1102a, 1102b. A differential amplifier 1106 can be coupled to the resistor 1104. The amplifier 1106 can generate and output signal that is indicative of the sensed current 1009.

Advantages of the magnetic field sensor 1000 are described above in conjunction with FIG. 10. Further advantages are obtained in the feedback arrangement of the magnetic field sensor 1100. In particular, it is known that magnetoresistance elements, both GMR and TMR elements, can suffer from being less than ideally linear throughout their operational range of magnetic fields. With a feedback arrangement, magnetic fields experienced by first and second magnetoresistance elements 1002, 1004 can remain near zero magnetic field, thus, with a feedback arrangement, nonlinearity effects are eliminated or nearly eliminated.

Further illustrative magnetic field sensors are described below. Some further examples of feedback arrangements are also described below. However, should be understood that all of the magnetic field sensors described herein can use a feedback arrangement like that described in conjunction with FIG. 11.

Figure 12:
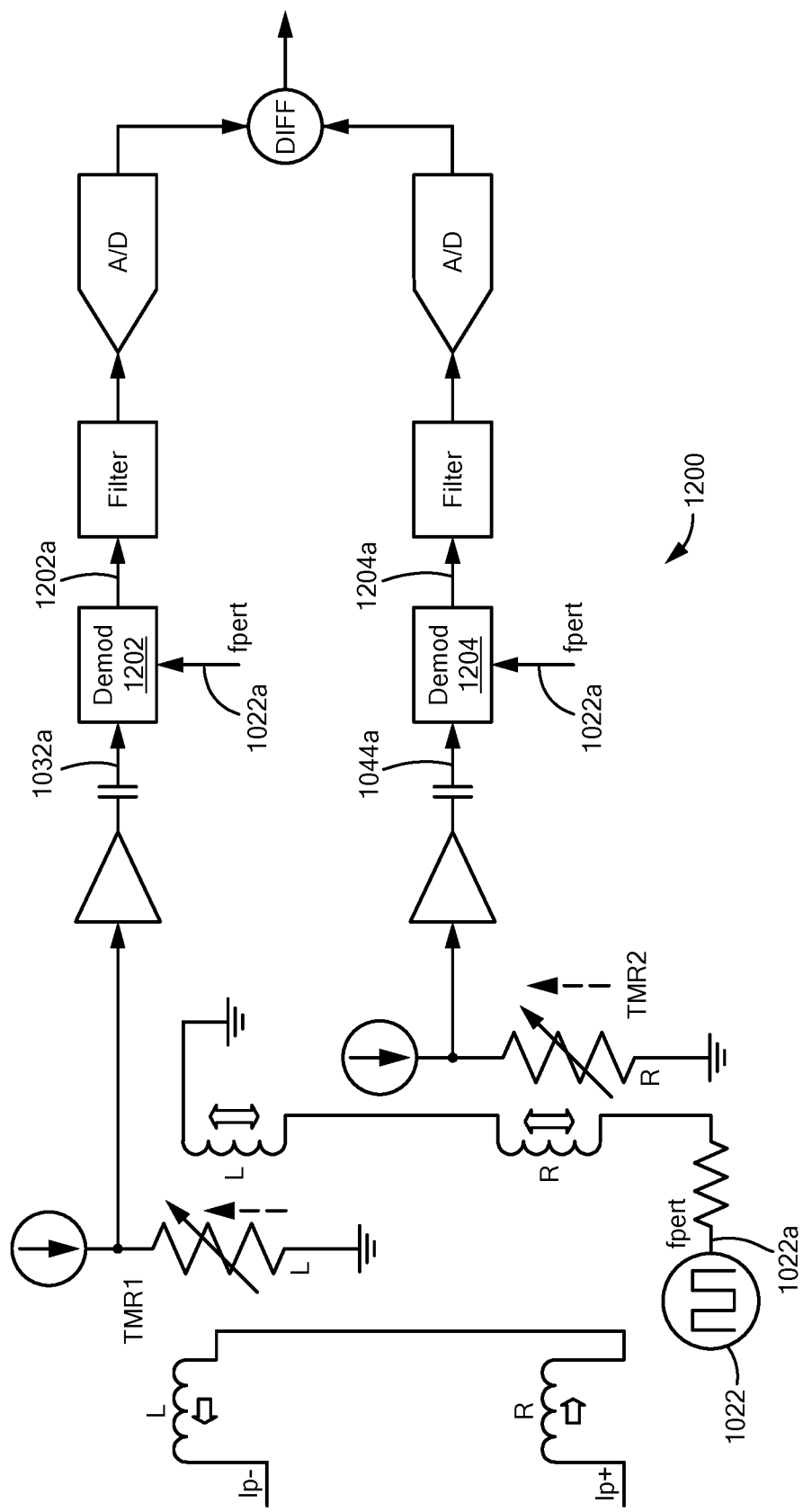
FIG. 12 is a schematic diagram of an illustrative current sensor having two TMR or GMR elements and two different amplitude detector circuits and with a non-feedback arrangement.

Read how to FIG. 12, in which like elements of FIG. 10 are shown having like reference designations, another illustrative magnetic field sensor 1200 can include most of the elements of the magnetic field sensor 1000 of FIG. 10. However, in the magnetic fields sensor 1200, rectifier circuits 1034, 1046 are not used, but are replaced by demodulator circuits 1202, 1204.

The demodulator circuit 1202 is coupled to receive the AC coupled signal 1032 and also coupled to receive the clock signal 1022. The demodulator circuit 1202 can be operable to switch back and forth between the AC coupled signal 1032a and an inverted version of the AC coupled signal 1032a. The clock signal 1022a can be the same frequency as the AC coupled signal 1032a. Thus, the demodulator circuit 1202 can be operable to generate a rectified signal 1202a, which can be the same as or similar to the rectified signal 1034a of FIG. 10.

The demodulator circuit 1204 is similarly coupled as the demodulator circuit 1202 and operates in the same way.

Figure 13:
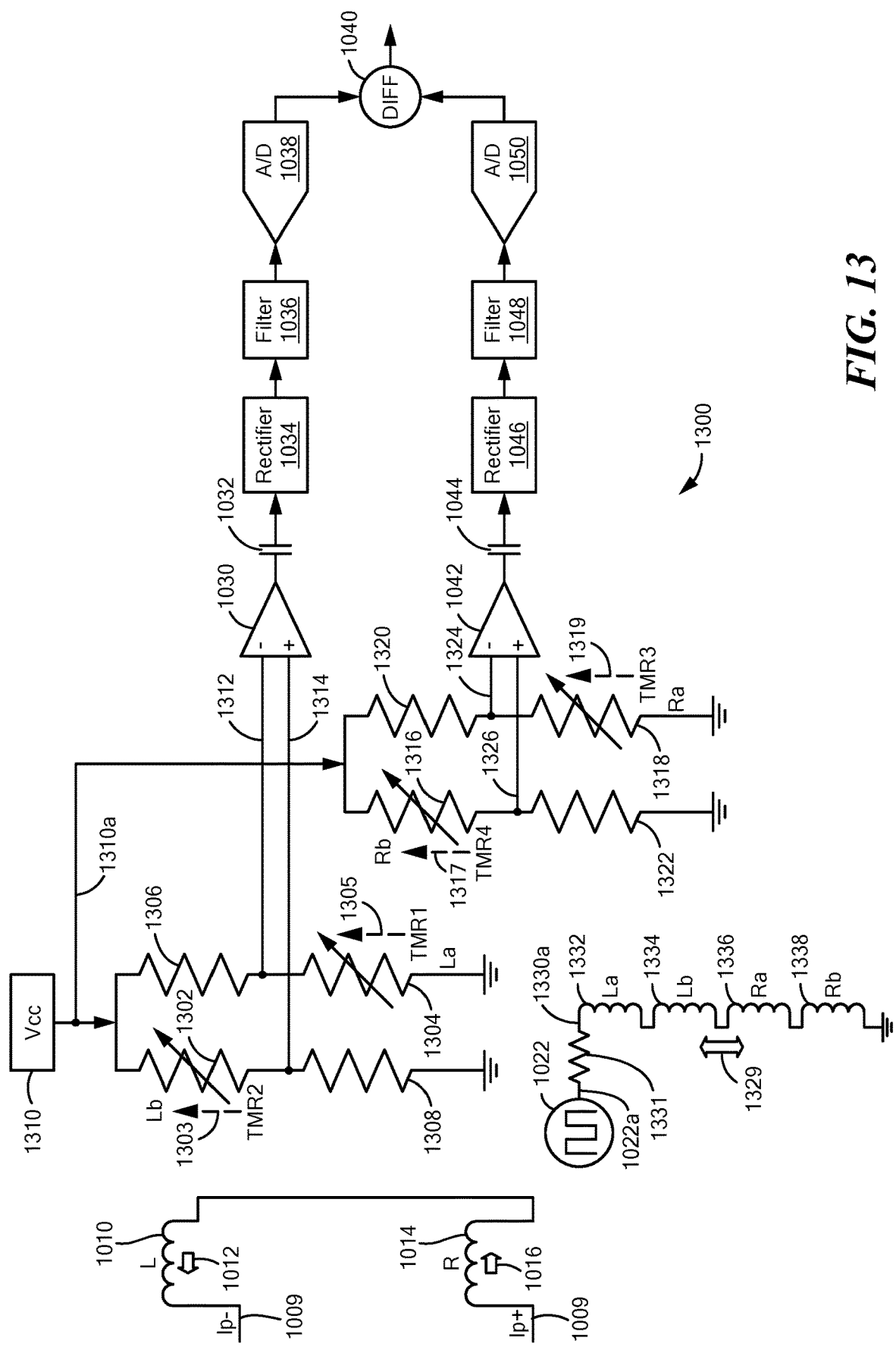
FIG. 13 is a schematic diagram of an illustrative current sensor having four TMR or GMR elements, arranged in two full bridges, and two amplitude detector circuits and with a non-feedback arrangement.

Referring now to FIG. 13, in which like elements of FIG. 10 are shown having like reference designations, another illustrative magnetic field sensor 1300 can include many of the elements of the magnetic field sensor 1000 of FIG. 10. Unlike the first and second magnetoresistance elements 1002, 1004 of FIG. 10, the magnetic field sensor 1300 can include first and second bridge circuits.

The first bridge circuit can include a first magnetoresistance element 1302 and a second magnetoresistance element 1304 coupled together with a first fixed resistor 1306 and a second fixed resistor 1308. The first bridge circuit is operable to generate a first differential bridge signal 1312, 1314.

The second bridge circuit can include a third magnetoresistance element 1316 and a fourth magnetoresistance element 1318 coupled together with a third fixed resistor 1320 and a fourth fixed resistor 1322. The second bridge circuit is operable to generate a second differential bridge signal 1324, 1326.

The first magnetoresistance element 1302 can have maximum response axis of the direction indicated by an arrow 1303. The second magnetoresistance element 1304 can have a maximum response axis of the direction indicated by an arrow 1305. The third magnetoresistance element 1316 can have a maximum response axis of the direction indicated by an arrow 1317. The fourth magnetoresistance element 1318 can have a maximum response axis of the direction indicated by an arrow 1319.

The first and second magnetoresistance elements 1302, 1304 can both be disposed proximate to each other and on the left side, for example, proximate to the left side of the current conductor 502 of FIG. 5. The third and fourth magnetoresistance elements 1316, 1318 can both be disposed proximate to each other and on the right side, for example, proximate to the right side of the current conductor 502 of FIG. 5.

The first sensed current conductor 1010, i.e., the left side of the current conductor 502 of FIG. 5, can be disposed proximate to the first and second magnetoresistance elements 1302, 1304. The second sensed current conductor 1014, i.e., the right side of the current conductor 502 of FIG. 5, can be disposed proximate to the third and fourth magnetoresistance elements 1316, 1318.

Also, unlike the first and second perturbing coils 1018, 1020 of FIG. 10, the magnetic field sensor 1300 can include first, second, third, and fourth perturbing coils 1332, 1334, 1336, 1338, respectively. The first perturbing coil 1332 can beast disposed proximate to the first magnetoresistance element 1302. The second perturbing coil 1334 can be disposed proximate to the second magnetoresistance element 1304. The third perturbing coil 1336 can beast disposed proximate to the third magnetoresistance element 1316. The fourth perturbing coil 1338 can be disposed proximate to the fourth magnetoresistance element 1318.

The first, second, third, and fourth perturbing coils 1332, 1334, 1336, 1338 can each generate AC magnetic fields with directions indicated by an arrow 1329. The directions indicated by the arrow 1329 are parallel to the maximum response axes 1303, 1305, 1317, 1319.

The magnetic field sensor 1300 can operate in much the same way as that described above for the magnetic field sensor 1000 of FIG. 10. Therefore, operational the magnetic field sensor 1300 is not described in detail herein.

Figure 14:
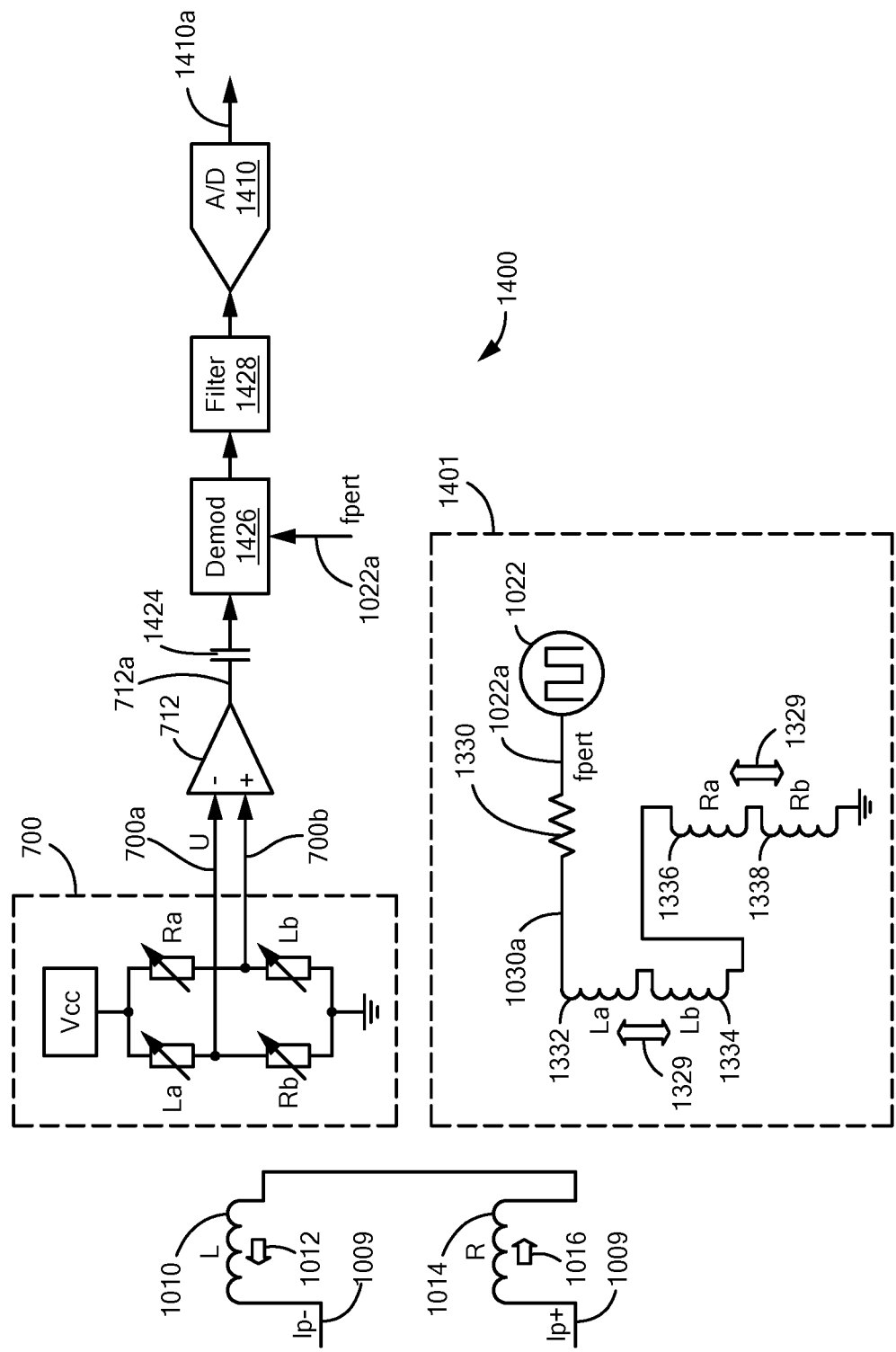
FIG. 14 is a schematic diagram of an illustrative current sensor having four TMR or GMR elements, arranged in one full bridge, and the two different amplitude detector circuits of FIG. 12 and with a non-feedback arrangement.

Referring now to FIG. 14, in which like elements of FIGS. 7, 10, and 13 are shown having like reference designations, another illustrative magnetic field sensor 1400 can have many characteristics that are similar to the magnetic field sensors 1000, 1200, and 1300 of FIGS. 10, 12, and 14.

The magnetic field sensor 1400 can include four magnetoresistance elements coupled together in a full bridge arrangement 700, which can be the same as or similar to the full bridge arrangement 700 of FIG. 7.

First and second magnetoresistance elements, La, Lb can both be disposed proximate to each other and on the left side, for example, on the left side of the current conductor 502 of FIG. 5. Third and fourth magnetoresistance elements Ra, Rb can both be disposed proximate to each other and on the right side, for example, on the right side of the current conductor 502 of FIG. 5.

The first perturbing coil 1332 can be disposed proximate to the first magnetoresistance element, La, the second perturbing coil 1334 can be disposed proximate to the second magnetoresistance element, Lb, the third perturbing coil 1336 can be disposed proximate to the third magnetoresistance element, Ra, and the fourth perturbing coil 1338 can be disposed proximate to the fourth magnetoresistance element, Rb.

Taken together the first, second, third, and fourth perturbing coils 1332, 1334, 1336, 1338 along with the clock signal generator 1022 and the resistor 1330 are referred to herein as a perturbing magnetic field signal generator 1401.

The difference signal 712a, like the difference signal 712a of FIG. 7, is already a signal that represents a difference of signals generated by magnetoresistance elements on the left and right sides, for example left and right sides of the current conductor 502 of FIG. 5. Thus, two circuit channels for left and right sides described in conjunction with magnetic field sensors of FIGS. 10, 11, 12, and 13, are not required.

The difference signal 712a can be received by a capacitor 1424, which can be coupled to a demodulator 1426, which can be coupled to a filter 1428, which can be coupled to an analog-to-digital converter 1410 to generate a digital signal 1410a. The demodulator 1426 and the filter 1428 form an amplitude detecting circuit as described above in conjunction with FIG. 12.

Values of the digital signal 1410a can be indicative of values of the sensed current signal 1009.

Figure 15:
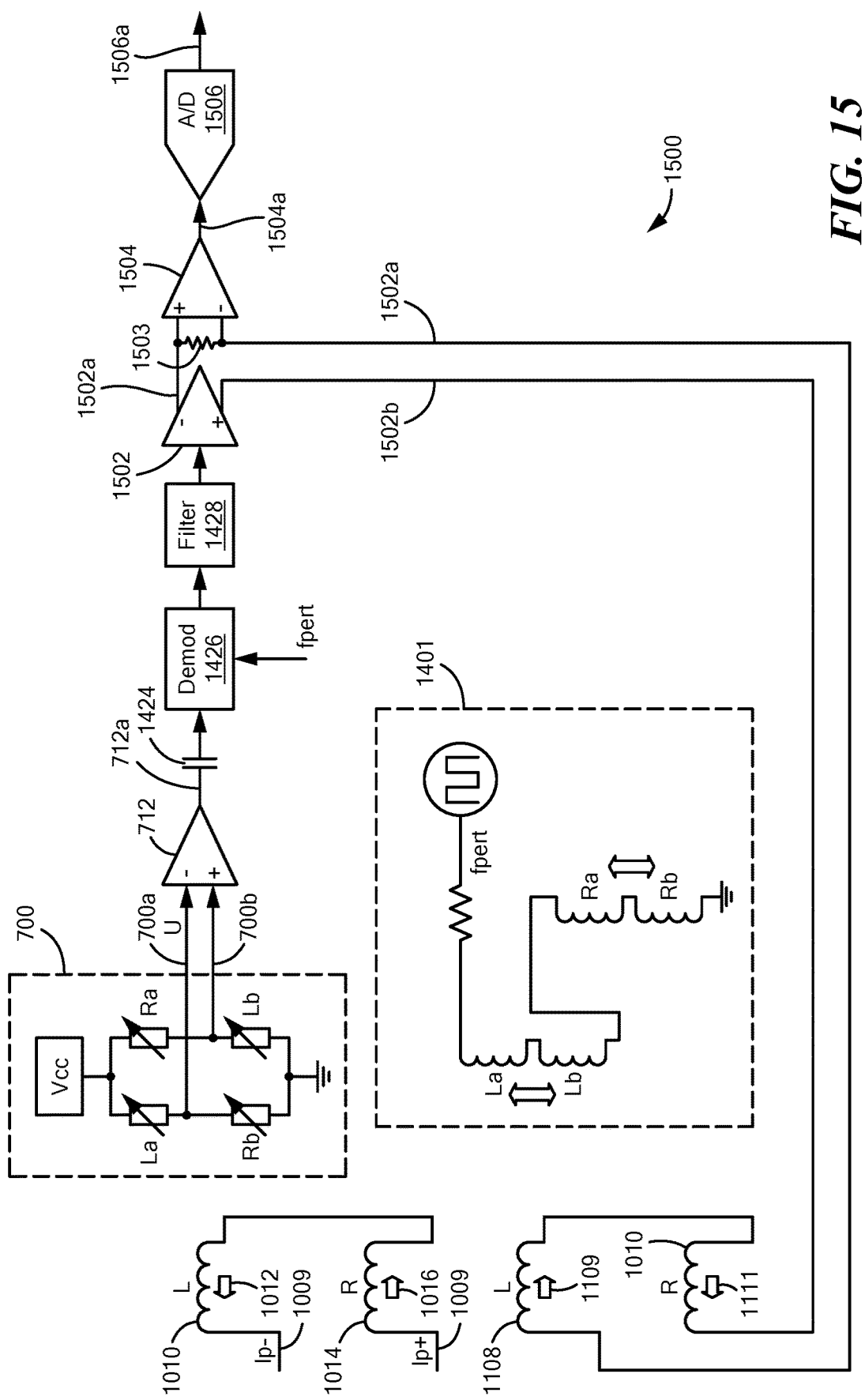
FIG. 15 is a schematic diagram of an illustrative current sensor having four TMR or GMR elements, arranged in one full bridge, and the two different amplitude detector circuits of FIG. 12 and with a feedback arrangement.

Referring now to FIG. 15, in which like elements of FIGS. 7, 10, 11, and 14 are shown having like reference designations a magnetic field sensor 1500 can be similar to the magnetic field sensor 1400 and FIG. 14 but also having a feedback arrangement of magnetic field sensor 1100 of FIG. 11.

Thus, the magnetic field sensor 1500 also can include a current driver 1502 coupled to the filter 1428 and operable to generate differential feedback current signal 1502a, 1502b received by the first and second feedback coils 1108, 1110 described above in conjunction with FIG. 11.

The magnetic field sensor 1500 can also include a resistor 1503 in series with one side of the differential current signal 1502a, 1502b. A voltage appears across the resistor 1503 with a value in accordance with the differential current signal 1502a, 1502b. A differential amplifier 1504 can be coupled to the resistor 1503. The differential amplifier 1506 can be operable to generate a signal 1504a, values of which can be indicative of the sensed current signal 1009. The signal 1504a can be coupled to an analog-to-digital converter 1506 can be operable to generate a digital signal 1506a, which can also be indicative of the sensed current signal 1009.

FIGS. 1-15 above describe circuits that can reduce an offset voltage and that can reduce an influence of stray external magnetic fields, at least stray fields parallel to reference directions of the TMR elements, i.e., directions to which the TMR element are directly responsive. In FIGS. 1-15, note that bias directions of bias layers of TMR element are all in the same direction. Closed loop arrangements describe above can help with effects of external stray magnetic fields in other directions.

Figure 16:
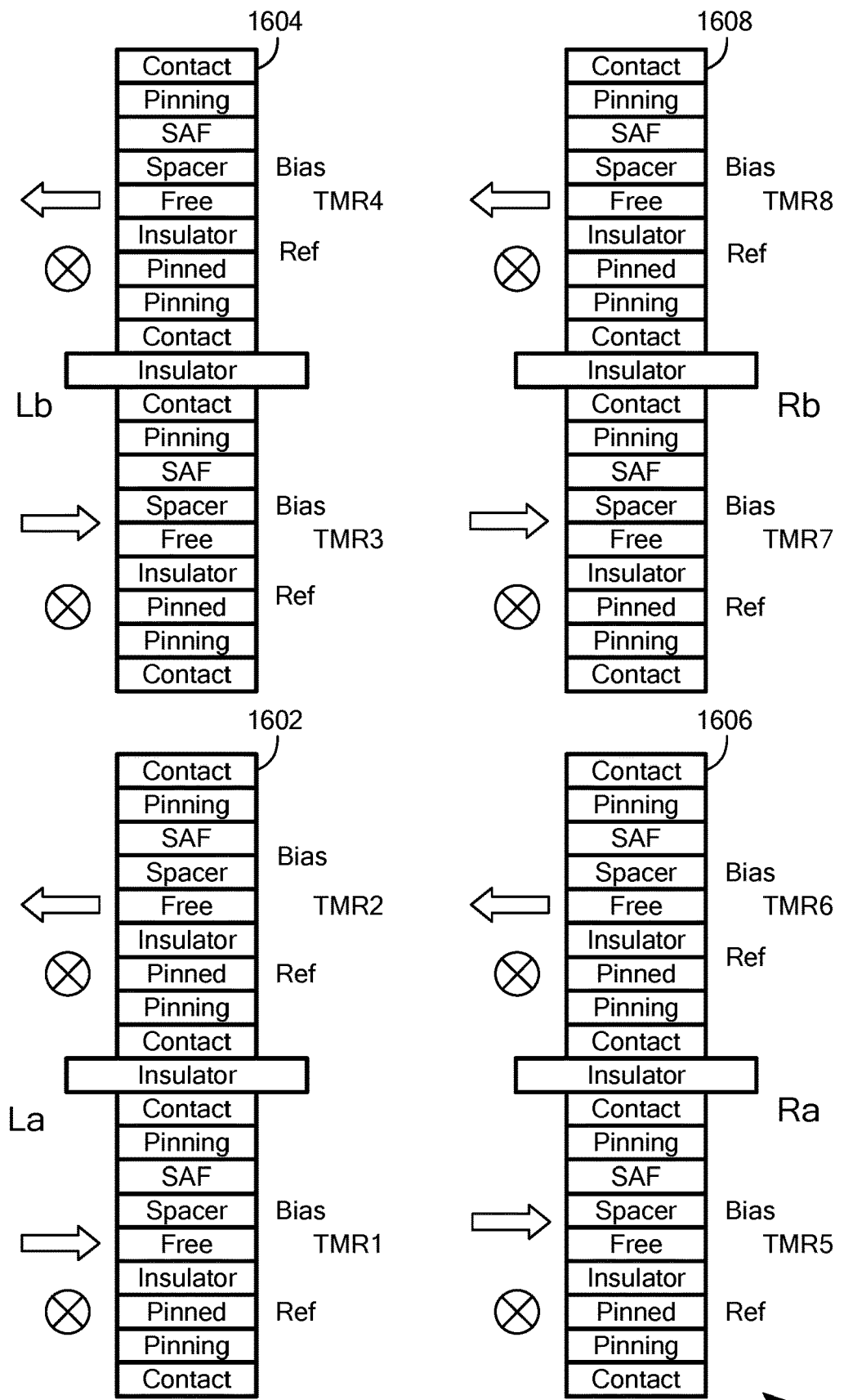
FIG. 16 is a block diagram showing an illustrative arrangement of eight TMR elements, pairs of the eight TMR elements stacked on top of each other separated by insulators to result in four double TMR elements.
Figure 18:
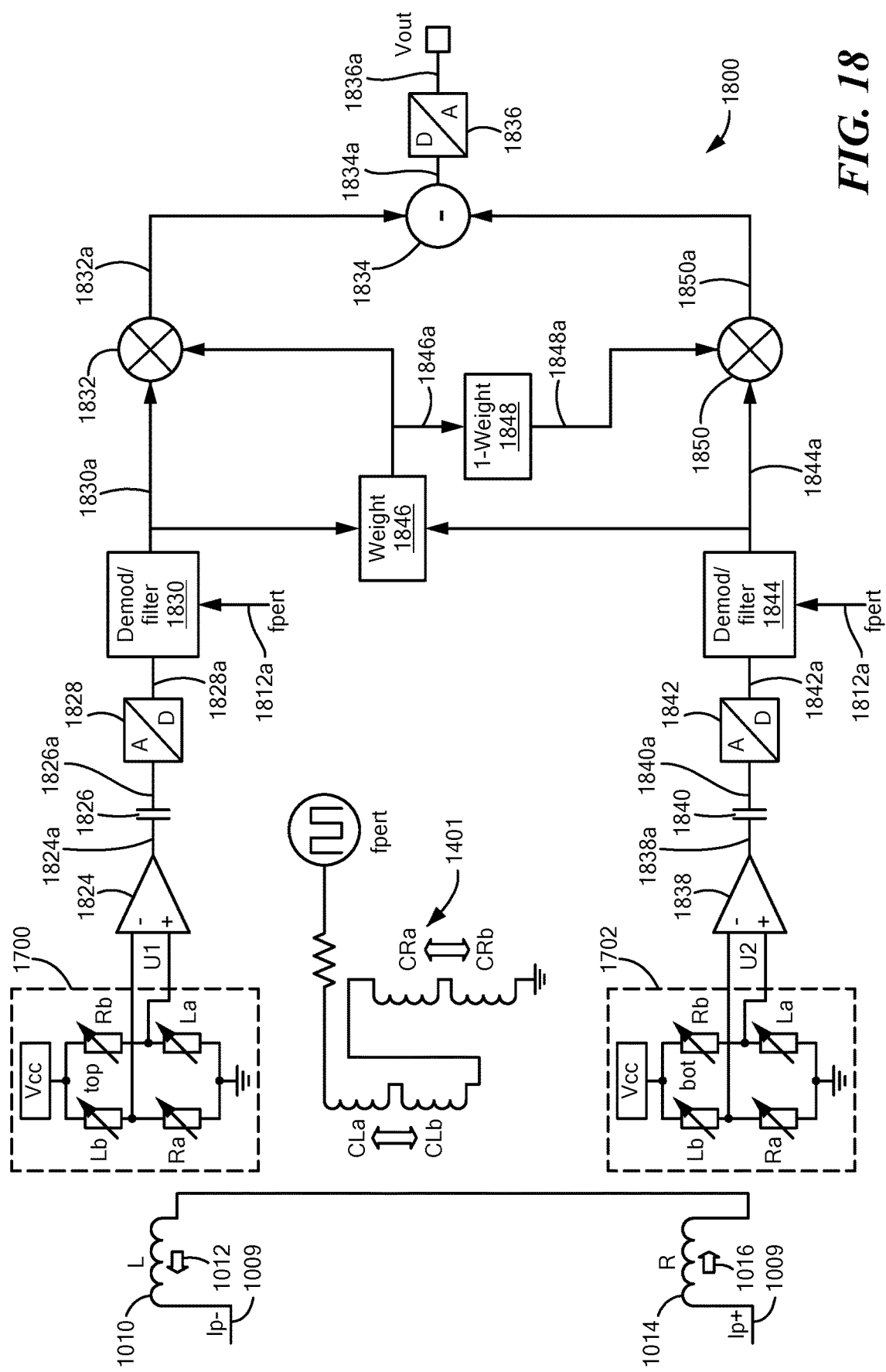
FIG. 18 is a schematic diagram of an illustrative current sensor having the two full bridge circuits of FIG. 17, and having the two different amplitude detector circuits of FIG. 12 and with a weighting circuit and a function circuit.

In contrast, FIGS. 16-18 below describe circuits that can reduce an offset voltage and can reduce an influence of stray external magnetic fields, at least stray fields parallel to bias directions of dual TMR elements, i.e., directions to which the dual TMR element are indirectly responsive, i.e., directions parallel to magnetic fields 503a, 503b that the magnetic field sensors attempt to measure. In FIGS. 16-18, note that bias directions of lower bias layers of the dual TMR elements are in a first direction and bias directions of upper bias layers of the dual TMR elements are in a second direction that opposes the first direction. An open loop arrangement shown in FIG. 18 can greatly reduce the effects of external stray magnetic fields parallel to bias directions without need of a closed loop arrangement.

Referring now to FIG. 16, the first second third and fourth dual TMR elements 1602, 1604, 1606, 1608 each include two TMR elements, for a total of eight TMR elements here labeled TMR1-TMR8. Taking the dual TMR element 1602 as being representative of other ones of the dual TMR elements, the dual TMR element 1602 includes a bottom TMR element, TMR1, and a top TMR element, TMR2, separated by a central thick insulator layer through which charge does not flow. Thus, TMR1 and TMR2 can be considered to be separate TMR elements, though they are in a dual TMR element, i.e., stacked, arrangement. With that said, it should be appreciated that, in other embodiments, the two TMR elements of each one of the dual TMR elements 1602, 1604, 1606, 1608 can be laterally displaced from each other, e.g., side by side from each other, rather than stacked, e.g., both upon a substrate, so long as magnetic directions are as shown. However, the stacked arrangement may have manufacturing advantages.

TMR elements TMR1 and TMR2 can each include a first electrical contact, a first antiferromagnetic pinning layer disposed over the first electrical contact, a first pinned layer disposed over the first antiferromagnetic pinning layer, an insulator layer (capable of charge tunneling) disposed over the first pinned layer, a free layer disposed over the insulator layer, a spacer layer disposed over the free layer, a second pinned layer (e.g., a synthetic antiferromagnet structure) disposed over the spacer layer, a second pinning layer disposed over the second pinned layer, and a second electrical contact disposed over the second pinning layer. The TMR structure will be understood from discussion above in conjunction with FIG. 3A. However, the stack of FIG. 3A is reversed from that shown in FIG. 16 and the stack of FIG. 3A does not show electrical contacts. Again, each having eight two electrical contacts as shown, it should be appreciated that, in other embodiments, the two TMR elements of each one of the dual TMR elements 1602, 1604, 1606, 1608 can be laterally displaced from each other, e.g., side by side from each other, rather than stacked, so long as magnetic directions are as shown.

The electrical contacts can be electrically coupled to known metal layers, directly or through vias.

It should be understood that, in each one of the eight TMR elements, the bottom pinning and pinned layers together form reference layers and the upper pinning, SAF, and spacer layers form bias layers that impart a bias magnetic field upon the free layer. All of the reference layers have magnetic fields that point in the same direction, while four of the bias layers have magnetic fields that point in an opposite direction from another four of the bias layers.

Each dual TMR element, e.g., 1602, can have two free layers that are biased by adjacent bias layers (i.e., bias layer structures) to have opposite magnetic directions by adjacent spacer layers of the bias layers.

In some embodiments, the bias layers and proximate free layers can have magnetic directions that are at ninety degrees relative to magnetic directions of associated reference layers, i.e., at ninety degrees relative to maximum response axes of associated dual TMR elements. In other embodiments, the bias layers and proximate free layers can have magnetic directions that are between about ninety degrees and about sixty degrees relative to magnetic directions of associated reference layers, i.e., within about ninety degrees and about sixty degrees relative to maximum response axes of associated dual TMR element. Nevertheless, it may be desirable to be as close to ninety degrees as possible.

The different directions of bias magnetic fields experienced by the free layers can be achieved by using particular materials with different thicknesses of the spacer layers immediately above the free layers. This arrangement of spacer layers is described in U.S. Pat. No. 9,529,060, issued Dec. 27, 2016, also in U.S. patent application Ser. No. 14/529,564, filed Oct. 31, 2014, and also in U.S. Pat. No. 9,812,637, issued Nov. 7, 2017, each of which is incorporated herein in its entirety. Advantages of using the two different bias directions will be understood from discussion in U.S. Pat. No. 9,812,637.

Forming the first, second, third, fourth dual TMR elements 1602, 1604, 1606, 1608 rather than eight separate TMR elements provides a structure that is easier to fabricate, particularly the structures shown that have spacers with different thicknesses. The dual TMR elements can be formed with one set of layer depositions.

It should be understood that each TMR element within a dual TMR element, e.g., 1602, has essentially the same direct response (ignoring offset differences) to the same external magnetic field, e.g., an external magnetic field parallel to the reference directions, i.e., the perturbing magnetic fields. It should be also understood that each TMR element within a dual TMR element, e.g., 1602, has an opposite indirect response (sensitivity change) to the same external magnetic field, e.g., an external magnetic field parallel to the bias directions, i.e., the magnetic field 503a of FIG. 5.

Taking, for example, a combination of left and right bottom TMR elements, e.g., a left TMR element TMR1 and a right TMR element TMR5 as in FIG. 6, amplitude changes (sensitivity changes) and signal phases shown in FIG. 8 can be the same. Taking, for example, a combination of left and right top TMR elements, e.g., a left TMR element TMR2 and a right TMR element TMR6 as in FIG. 6, amplitude changes (sensitivity changes) and signal amplitudes shown in FIG. 8 can be swapped left and right, resulting in signals 812a and 818a swapping phases. Accordingly, when demodulated as represented in FIG. 9, signals amplitudes can be swapped left and right, resulting in signals 912a and 918a swapping polarity.

Referring now to FIG. 17, in which like designation of FIG. 16 are shown having the same reference designations. The top TMR elements of each of the dual TMR elements 1600 of FIG. 16 can be arranged in a first full bridge 1700, also labeled top. Similarly, the bottom TMR elements of each of the dual TMR elements 1600 of FIG. 16 can be arranged in a second full bridge 1702, also labeled bottom.

From discussion above in conjunction with FIG. 16, the top and bottom full bridges 1700, 1702 can have the same direct responses to the same magnetic field (i.e., due to the perturbing magnetic fields generated by perturbing coils) but opposite indirect (sensitivity) responses (i.e., due to the sensed magnetic field generated by the current conductor portions 502c, 502d of FIG. 5). Thus, for reasons discussed above in conjunction with FIG. 16, signals U1 and U2 can have opposite signs (phases).

In some embodiments, if desired, the above-mentioned opposite indirect responses can be corrected merely by using U=R−L instead of U=L−R.

Referring now to FIG. 18, in which like elements of FIGS. 10 and 17 are shown having the same reference designations, another illustrative magnetic field sensor 1800 can include the two full bridges 1700, 1702 of FIG. 17. Magnetoresistance elements labeled Lb and La can be disposed proximate to the first portion 1010, e.g., a left portion 502c of the current conductor 502 of FIG. 5. Magnetoresistance elements labeled Ra and Rb can be disposed proximate to the second portion 1014, i.e., a right portion 502d of the current conductor 502 of FIG. 5.

The magnetic field sensor 1800 can also include the perturbing magnetic field signal generator 1401 of FIG. 14. The four perturbing coils are labeled CLa, CLb, CRa, CRb, and can be disposed proximate to four dual TMR elements having labels La, Lb, Ra, Rb, respectively, in FIG. 18 and also according to similar labels of FIGS. 16 and 17.

The first full bridge 1700 can generate a differential signal U1 and the second full bridge 1702 can generate a differential signal U2. The differential signal U1 is responsive to the top TMR elements of FIG. 16 and the differential signal U2 is responsive to the bottom TMR elements of FIG. 16. For reasons discussed above in conjunction with FIG. 16, signals U1 and U2 have opposite signs (phases).

A differential amplifier 1824 can receive the differential signal U1 and can generate an amplified signal 1824a. A differential amplifier 1838 can receive the differential signal U2 and can generate and amplified signal 1838a.

A capacitor 1826 can receive the amplified signal 1824a and can produce an AC coupled signal 1826a. A capacitor 1840 can receive the amplified signal 1838a and can produce an AC coupled signal 1840a.

An analog-to-digital converter 1828 can receive the AC coupled signal 1826a and can generate a converted signal 1828a. An analog-to-digital converter 1842 can receive the AC coupled signal 1840a and to generate a converted signal 1842a.

A combined demodulator and filter circuit 1830 can receive the converted signal 1828a and can generate an amplitude signal 1830a. A combined demodulator and filter circuit 1844 can receive the converted signal 1842a and can generate an amplitude signal 1844a. Amplitude signal are described above in conjunction with FIG. 9.

The combined demodulator and filter circuits 1830, 1844 can each be the same as or similar to the demodulator 1202 of FIG. 12 combined with the filter 1036 of FIG. 10.

A weighting circuit 1846 can be coupled to receive the amplitude signals 1830a, 1844a and operable to generate a weighting value 1846a, W. The weighting value can be calculated in the following way:

If U1<U2 (i.e., |amplitude signal 1830a| is less than |amplitude signal 1844a|)

$$\text{then } W = 1 + U1/U2 \tag{1}$$

(i.e., W=1+1830a/1844a)

If U1 not <U2 (i.e., |amplitude signal 1830a| is not less than |amplitude signal 1844a|)

$$\text{Then } W = -U2/U1 \tag{2}$$

(i.e., W=−[1844a/1830a]

where symbols | | indicate absolute value.

A function module 1848 can be coupled to receive the weighting value 1846a and operable to generate a function value 1848a, F, according to 1−W.

A multiplier 1832 can receive the amplitude signal 1830a and the weighting value 1846a and can be operable to multiple the two to generate a scaled value 1832a. A multiplier 1850 can receive the amplitude signal 1844a and the function value 1846a and can be operable to multiply the two to generate a scaled value 1850a.

A difference module 1834 can be coupled to receive the scaled values 1832a, 1848a and can be operable to generate a difference signal 1834 representative of the sensed current 1009 difference of signals associated with signals U1 and U2

A digital to analog converter 1836 can be coupled to receive the difference signal and can be operable to generate a digital signal 1836a also representative of the sensed current 1109.

In alternate embodiments, the scaling value, W, can be calculated in a different way described below, using a variable, C, that can be a calibration value that can be temperature dependent.

If U1<U2 (i.e., |amplitude signal 1830*a*| is greater than |amplitude signal 1844*a*|)

$$W = 1 - C + U1/U2 \quad (3)$$

(i.e., W=1−C+1830*a*/1844*a*)
If U1 not <U2

$$W = C - U2/U1 \quad (4)$$

(i.e., W=C−1844*a*/1830*a*)

Figure 19:
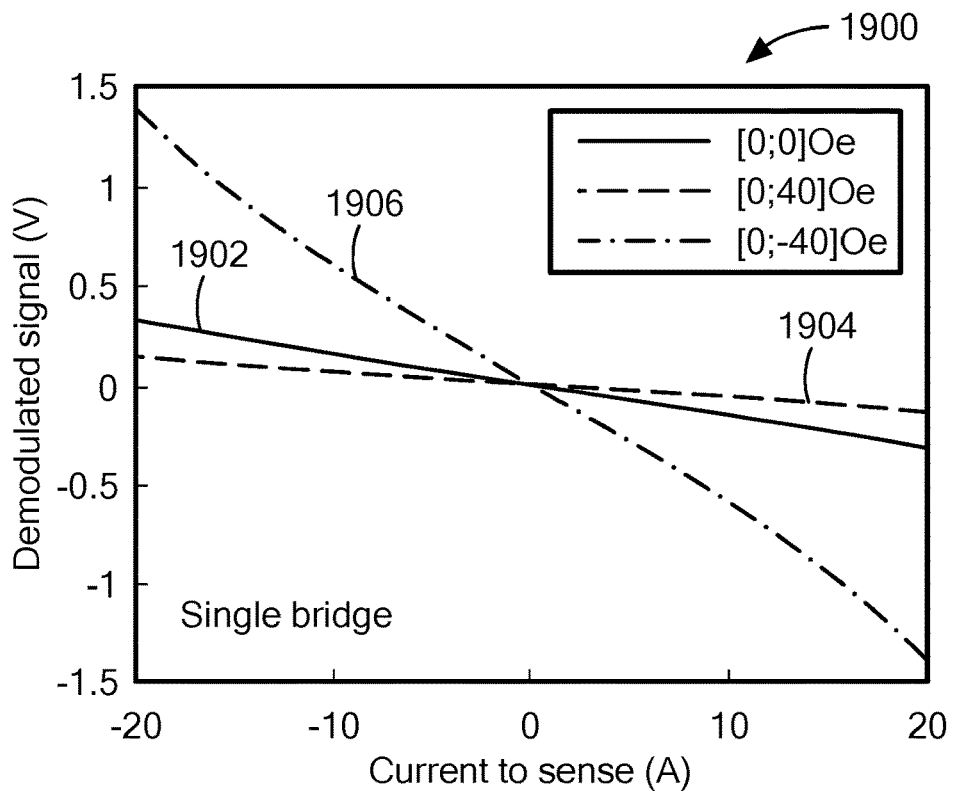
FIGS. 19-22 are four graphs showing reduced influence of particular stray external magnetic fields of the magnetic field sensor of FIG. 18.

Referring now to FIG. 19, a graph 1900 can be representative of behaviors of magnetic field sensors of FIGS. 1-15, i.e., without the dual TMR elements of FIG. 16 that have opposing bias fields and without weighting provided by the magnetic field sensor 1800 of FIG. 18.

A curve 1902 is indicative of a current to output signal transfer function of a magnetic field sensor, e.g., the magnetic field sensor 1400 of FIG. 14, when no external stray field is applied.

A curve 1904 is indicative of a current to output signal transfer function of a magnetic field sensor, e.g., the magnetic field sensor 1400 of FIG. 14, when an external stray field is applied in a first direction parallel to the bias direction of associated TMR elements, e.g., in a first direction parallel to the magnetic fields 503*a*, 503*b* of FIG. 5, and with an amplitude of forty Oersteds.

A curve 1906 is indicative of a current to output signal transfer function of a magnetic field sensor, e.g., the magnetic field sensor 1400 of FIG. 14, when an external stray field is applied in a second direction opposing the first direction parallel to the bias direction of associated TMR elements, e.g., in a second direction parallel to the magnetic fields 503*a*, 503*b* of FIG. 5, and with an amplitude of minus forty Oersteds.

It can be seen that the magnetic field sensor 1400 is greatly influenced by external stray magnetic fields in direction parallel to the bias direction of the TMR elements.

Figure 20:
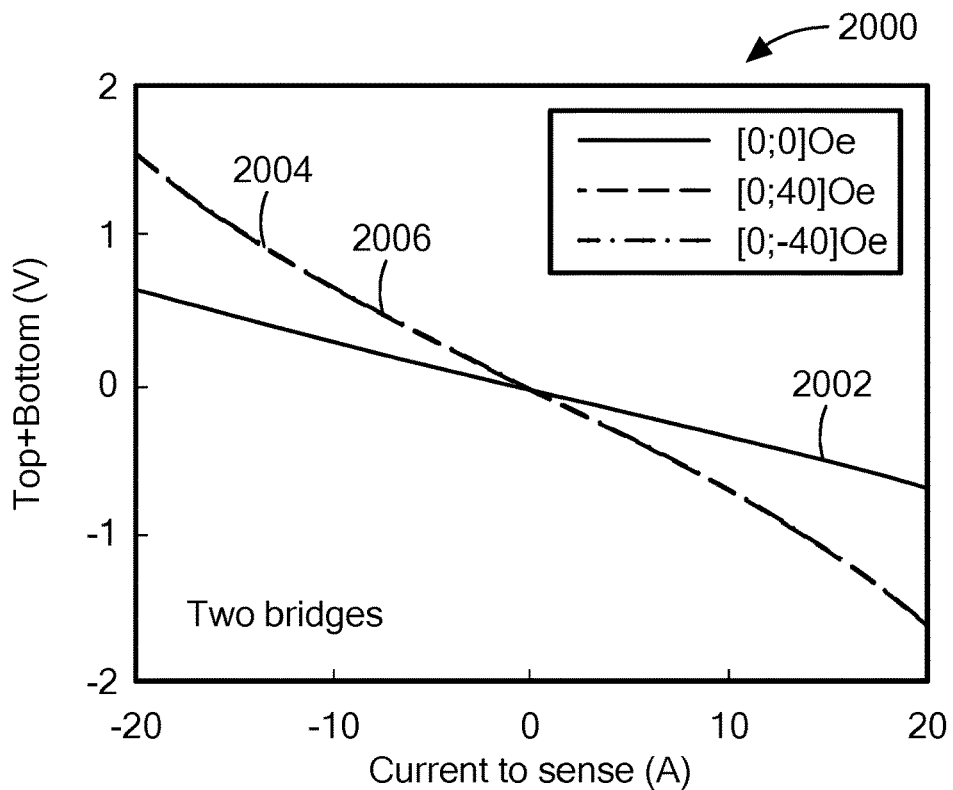

Referring now to FIG. 20, a graph 2000 can be representative of behaviors of magnetic field sensors of FIGS. 16-18, i.e., with the dual TMR elements of FIG. 16 that have opposing bias fields but without weighting provided by the magnetic field sensor 1800 of FIG. 18.

A curve 2002 is indicative of a current to output signal transfer function of a magnetic field sensor, e.g., the magnetic field sensor 1800 of FIG. 18 (but without weighting), when no external stray field is applied.

A curve 2004 is indicative of a current to output signal transfer function of a magnetic field sensor, e.g., the magnetic field sensor 1800 of FIG. 18 (but without weighting), when an external stray field is applied in a first direction parallel to the bias directions of associated dual TMR elements, e.g., in a first direction parallel to the magnetic fields 503*a*, 503*b* of FIG. 5, and with an amplitude of forty Oersteds.

A curve 2006 is indicative of a current to output signal transfer function of a magnetic field sensor, e.g., the magnetic field sensor 1800 of FIG. 18 (but without weighting), when an external stray field is applied in a second direction opposing the first direction parallel to the bias directions of associated dual TMR elements, e.g., in a second direction parallel to the magnetic fields 503*a*, 503*b* of FIG. 5, and with an amplitude of minus forty Oersteds.

It can be seen that the magnetic field sensor 1800 (but without weighting), is less influenced by external stray magnetic fields in direction parallel to the bias directions of the dual TMR elements than is the magnetic field sensor 1400 of FIG. 14.

Figure 21:
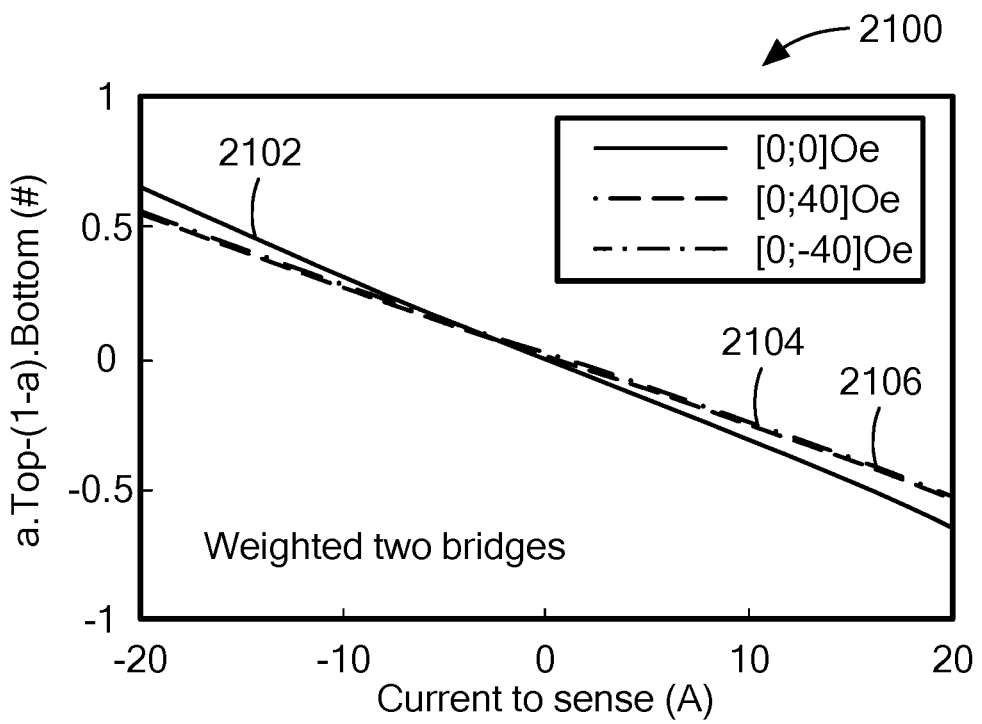

Referring now to FIG. 21, a graph 2100 can be representative of behaviors of magnetic field sensors of FIGS. 16-18, i.e., with the dual TMR elements of FIG. 16 that have opposing bias fields and with the weighting provided by the magnetic field sensor 1800 of FIG. 18.

A curve 2102 is indicative of a current to output signal transfer function of a magnetic field sensor, e.g., the magnetic field sensor 1800 of FIG. 18 (with weighting in accordance with equations (1) and (2) above.), when no external stray field is applied.

A curve 2104 is indicative of a current to output signal transfer function of a magnetic field sensor, e.g., the magnetic field sensor 1800 of FIG. 18 (with weighting), when an external stray field is applied in a first direction parallel to the bias directions of associated dual TMR elements, e.g., in a first direction parallel to the magnetic fields 503*a*, 503*b* of FIG. 5, and with an amplitude of forty Oersteds.

A curve 2106 is indicative of a current to output signal transfer function of a magnetic field sensor, e.g., the magnetic field sensor 1800 of FIG. 18 (with weighting), when an external stray field is applied in a second direction opposing the first direction parallel to the bias directions of associated dual TMR elements, e.g., in a second direction parallel to the magnetic fields 503*a*, 503*b* of FIG. 5, and with an amplitude of minus forty Oersteds.

It can be seen that the magnetic field sensor 1800 (with weighting), is less influenced by external stray magnetic fields in direction parallel to the bias directions of the dual TMR elements than is the magnetic field sensor 1400 of FIG. 14 and than is the magnetic field sensor 1800 of FIG. 18 without weighting.

Figure 22:
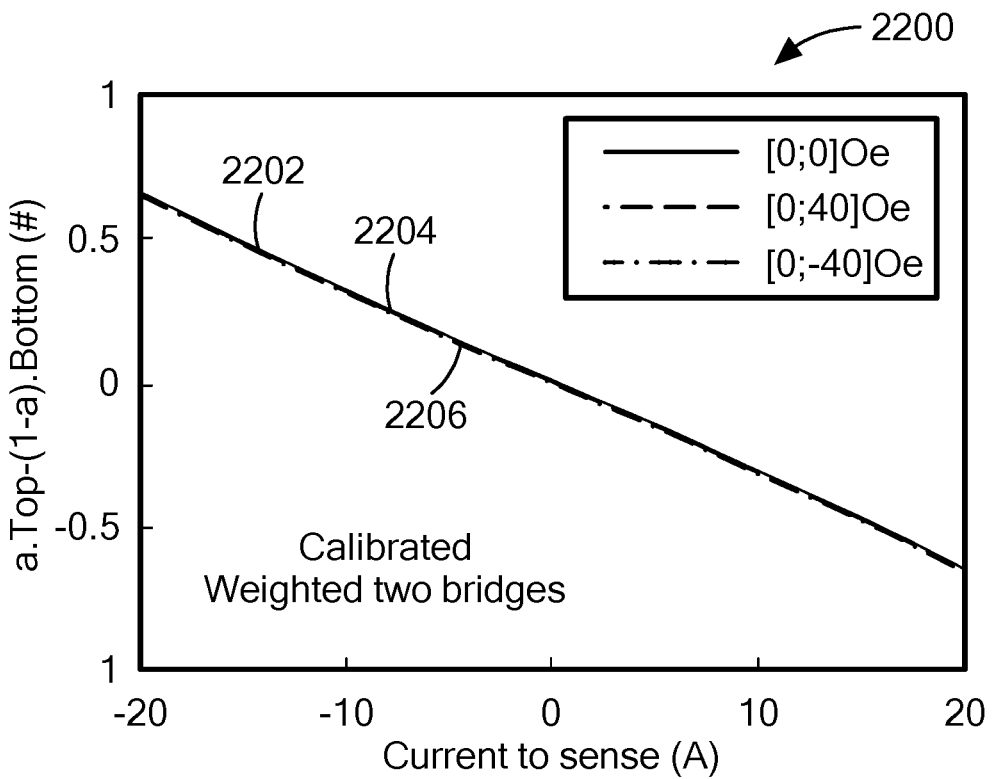

Referring now to FIG. 22, a graph 2200 can be representative of behaviors of magnetic field sensors of FIGS. 16-18, i.e., with the dual TMR elements of FIG. 16 that have opposing bias fields and with the weighting provided by the magnetic field sensor 1800 of FIG. 18.

A curve 2202 is indicative of a current to output signal transfer function of a magnetic field sensor, e.g., the magnetic field sensor 1800 of FIG. 18 (with weighting in accordance with equations (3) and (4) above that use the value C) when no external stray field is applied.

A curve 2204 is indicative of a current to output signal transfer function of a magnetic field sensor, e.g., the magnetic field sensor 1800 of FIG. 18 (with weighting and with the value C), when an external stray field is applied in a first direction parallel to the bias directions of associated dual TMR elements, e.g., in a first direction parallel to the magnetic fields 503*a*, 503*b* of FIG. 5, and with an amplitude of forty Oersteds.

A curve 2206 is indicative of a current to output signal transfer function of a magnetic field sensor, e.g., the magnetic field sensor 1800 of FIG. 18 (with weighting and with the value C), when an external stray field is applied in a second direction opposing the first direction parallel to the bias directions of associated dual TMR elements, e.g., in a second direction parallel to the magnetic fields 503*a*, 503*b* of FIG. 5, and with an amplitude of minus forty Oersteds.

It can be seen that the magnetic field sensor 1800 (with weighting and with the factor C), is less influenced by external stray magnetic fields in direction parallel to the bias directions.

All references cited herein are hereby incorporated herein by reference in their entirety.

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

Elements of embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A magnetic field sensor, comprising:
   a substrate;
   a first magnetoresistance element disposed over the substrate, comprising:
      a first maximum response axis;
      a first bias layer structure configured to generate a first bias magnetic field with a first magnetic direction between ninety degrees and sixty degrees relative to the first maximum response axis;
      a first electrical contact coupled to a bottom of the first magnetoresistance element; and
      a second electric contact coupled to a top of the first magnetoresistance element, wherein the magnetic field sensor further comprises:
   a second magnetoresistance element disposed over the substrate, comprising:
      a second maximum response axis parallel to the first maximum response axis;
      a second bias layer structure configured to generate a second bias magnetic field with a second magnetic direction parallel to the first magnetic direction and opposed to the first magnetic direction;
      a third electrical contact coupled to a bottom of the second magnetoresistance element; and
      a fourth electric contact coupled to a top of the second magnetoresistance element.

2. The magnetic field sensor of claim 1, wherein the second magnetoresistance element is disposed over the first magnetoresistance element, and wherein the magnetic field sensor further comprises an insulator layer disposed between the first and second magnetoresistance elements.

3. The magnetic field sensor of claim 2, wherein the first and second magnetoresistance elements are TMR elements.

4. The magnetic field sensor of claim 1, further comprising:
   a third magnetoresistance element disposed over the substrate, comprising:
      a third maximum response axis;
      a third bias layer structure configured to generate a third bias magnetic field with a third magnetic direction between ninety degrees and sixty degrees relative to the third maximum response axis;
      a fifth electrical contact coupled to a bottom of the third magnetoresistance element; and
      a sixth electric contact coupled to a top of the third magnetoresistance element, wherein the magnetic field sensor further comprises:
   a fourth magnetoresistance element disposed over the substrate, comprising:
      a fourth maximum response axis parallel to the third maximum response axis;
      a fourth bias layer structure configured to generate a fourth bias magnetic field with a fourth magnetic direction parallel to the third magnetic direction and opposed to the third magnetic direction;
      a seventh electrical contact coupled to a bottom of the fourth magnetoresistance element; and
      an eighth electric contact coupled to a top of the fourth magnetoresistance element.

5. The magnetic field sensor of claim 4, wherein the second magnetoresistance element is disposed over the first magnetoresistance element and the fourth magnetoresistance element is disposed over the third magnetoresistance element, wherein the magnetic field sensor further comprises:
   a first insulator layer disposed between the first and second magnetoresistance elements; and
   a second insulator layer disposed between the third and fourth magnetoresistance elements.

6. The magnetic field sensor of claim 5, wherein the first, second, third and fourth magnetoresistance elements are TMR elements.

7. The magnetic field sensor of claim 4, further comprising:
   a fifth magnetoresistance element disposed over the substrate, comprising;
      a fifth maximum response axis;
      a fifth bias layer structure configured to generate a fifth bias magnetic field with a fifth magnetic direction between ninety degrees and sixty degrees relative to the fifth maximum response axis;
      a ninth electrical contact coupled to a bottom of the fifth magnetoresistance element; and
      a tenth electric contact coupled to a top of the fifth magnetoresistance element, wherein the magnetic field sensor further comprises:
   a sixth magnetoresistance element disposed over the substrate, comprising:
      a sixth maximum response axis parallel to the fifth maximum response axis;
      a sixth bias layer structure configured to generate a sixth bias magnetic field with a sixth magnetic direction parallel to the fifth magnetic direction and opposed to the fifth magnetic direction;
      an eleventh electrical contact coupled to a bottom of the sixth magnetoresistance element; and
      a twelfth electric contact coupled to a top of the sixth magnetoresistance element, wherein the magnetic field sensor further comprises:
   a seventh magnetoresistance element disposed over the substrate, comprising;
      a seventh maximum response axis;
      a seventh bias layer structure configured to generate a seventh bias magnetic field with a seventh magnetic direction between ninety degrees and sixty degrees relative to the seventh maximum response axis;
      a thirteenth electrical contact coupled to a bottom of the seventh magnetoresistance element; and
      a fourteenth electric contact coupled to a top of the seventh magnetoresistance element, wherein the magnetic field sensor further comprises:
   an eighth magnetoresistance element disposed over the substrate, comprising:
      an eighth maximum response axis parallel to the seventh maximum response axis;
      an eighth bias layer structure configured to generate an eighth bias magnetic field with an eighth magnetic direction parallel to the seventh magnetic direction and opposed to the seventh magnetic direction;
      a fifteenth electrical contact coupled to a bottom of the eighth magnetoresistance element; and a sixteenth electric contact coupled to a top of the eighth magnetoresistance element.

8. The magnetic field sensor of claim 7, wherein the second magnetoresistance element is disposed over the first magnetoresistance element, the fourth magnetoresistance element is disposed over the third magnetoresistance element, the sixth magnetoresistance element is disposed over the fifth magnetoresistance element, and the eighth magnetoresistance element is disposed over the seventh magnetoresistance element, wherein the magnetic field sensor further comprises:
 a first insulator layer disposed between the first and second magnetoresistance elements;
 a second insulator layer disposed between the third and fourth magnetoresistance elements;
 a third insulator layer disposed between the fifth and sixth magnetoresistance elements; and
 a fourth insulator layer disposed between the seventh and eighth magnetoresistance elements.

9. The magnetic field sensor of claim 8, wherein the first, second, third, fourth, fifth, sixth, seventh, and eighth magnetoresistance elements are TMR elements.

10. The magnetic field sensor of claim 9, further comprising:
 a first magnetic field generator disposed proximate to the first and second magnetoresistance elements, the first magnetic field generator configured to generate a first AC magnetic field experienced by the first and second magnetoresistance elements and parallel to the first and second maximum response axes;
 a second magnetic field generator disposed proximate to the third and fourth magnetoresistance elements, the second magnetic field generator configured to generate a second AC magnetic field experienced by the third and fourth magnetoresistance elements and parallel to the third and fourth maximum response axes;
 a third magnetic field generator disposed proximate to the fifth and sixth magnetoresistance elements, the third magnetic field generator configured to generate an AC magnetic field experienced by the fifth and sixth magnetoresistance elements and parallel to the fifth and sixth maximum response axes; and
 a fourth magnetic field generator disposed proximate to the seventh and eighth magnetoresistance elements, the fourth magnetic field generator configured to generate a fourth AC magnetic field experienced by the seventh and eighth magnetoresistance elements and parallel to the seventh and eighth maximum response axes.

11. The magnetic field sensor of claim 10, further comprising:
 a current conductor comprising:
  a first current conductor portion disposed proximate to the first, second, third, and fourth magnetoresistance elements; and
  a second current conductor portion disposed proximate to the fifth, sixth, seventh and eighth magnetoresistance elements.

12. The magnetic field sensor of claim 11, wherein the first current conductor portion is configured to generate a first current conductor magnetic field experienced by the first, second, third and fourth magnetoresistance elements in response to a sensed current passing through the current conductor, wherein the second current conductor portion is configured to generate a second current conductor magnetic field experienced by the fifth, sixth, seventh, and eighth magnetoresistance elements in response to the sensed current passing through the current conductor.

13. The magnetic field sensor of claim 12, wherein the first current conductor magnetic field is parallel to the first, second, third and fourth magnetic directions of the first, second, third, and fourth bias layer structures, respectively, and wherein the second current conductor magnetic field is parallel to the fifth, sixth, seventh, and eighth magnetic directions of the fifth, sixth, seventh, and eighth bias layer structures, respectively.

14. The magnetic field sensor of claim 11, further comprising:
 a substrate holding the first, second, third, fourth, fifth, sixth, seventh, and eighth magnetoresistance elements, and holding the first, second, third and fourth magnetic field generators; and
 a lead frame having a plurality of leads, wherein the current conductor comprises a current path between two of the plurality of leads.

15. The magnetic field sensor of claim 14, wherein the current conductor comprises an open loop such that the current flows in a first direction at a first one of the two of the plurality of leads and flows in a second direction opposing the first direction at a second different one of the two of the plurality of leads.

16. The magnetic field sensor of claim 9, wherein the first, third, fifth, and seventh magnetoresistance elements are coupled in a first full bridge, and wherein the second, fourth, sixth, and eighth magnetoresistance elements are coupled in a second full bridge.

17. The magnetic field sensor of claim 16, further comprising:
 a first amplitude detecting circuit operable to detect a first amplitude of a first signal generated in response to the first full bridge; and
 a second amplitude detecting circuit operable to detect a second amplitude of a second signal generated in response to the second full bridge.

18. The magnetic field sensor of claim 17, wherein the first amplitude detecting circuit comprises a first rectifier coupled to a first filter and wherein the second amplitude detecting circuit comprises a second rectifier circuit coupled to a second filter.

19. The magnetic field sensor of claim 17, wherein the first amplitude detecting circuit comprises a first demodulator and wherein the second amplitude detecting circuit comprises a second demodulator.

20. The magnetic field sensor of claim 17, further comprising:
 a weighting module coupled to the first and second amplitude detecting circuits and configured to generate weight value; and
 a function module coupled to the weighting module and configured to generate a function value as one minus the weight value.

21. The magnetic field sensor of claim 20, further comprising:
 a first multiplier coupled to the first amplitude detecting circuit and coupled to the weighting module and configured to generate a first product value as a product of the first amplitude and the weight value; and
 a second multiplier coupled to the second amplitude detecting circuit and coupled to the function module and configured to generate a second product value as a product of the second amplitude and the function value; and a differencing circuit coupled to the first and second multipliers and configured to generate a difference value as a difference of the first and second product values.

22. A method of measuring a magnetic field with a magnetic field sensor, comprising:
generating a first AC magnetic field experienced by
a first magnetoresistance element, comprising:
a first maximum response axis;
a first bias layer structure configured to generate a first bias magnetic field with a first magnetic direction between ninety degrees and sixty degrees relative to the first maximum response axis;
a first electrical contact coupled to a bottom of the first magnetoresistance element; and
a second electric contact coupled to a top of the first magnetoresistance element, and experienced by
a second magnetoresistance element, comprising:
a second maximum response axis parallel to the first maximum response axis;
a second bias layer structure configured to generate a second bias magnetic field with a second magnetic direction parallel to the first magnetic direction and opposed to the first magnetic direction, wherein the first AC magnetic field is parallel to the first and second maximum response axes;
a third electrical contact coupled to a bottom of the second magnetoresistance element; and
a fourth electric contact coupled to a top of the second magnetoresistance element.

23. The method of claim 22, wherein the second magnetoresistance element is disposed over the first magnetoresistance element, and wherein an insulator layer is disposed between the first and second magnetoresistance elements.

24. The method of claim 23, wherein the first and second magnetoresistance elements are TMR elements.

25. The method of claim 22, further comprising:
generating a second AC magnetic field experienced by
a third magnetoresistance element, comprising:
a third maximum response axis;
a third bias layer structure configured to generate a third bias magnetic field with a third magnetic direction between ninety degrees and sixty degrees relative to the third maximum response axis,
a fifth electrical contact coupled to a bottom of the third magnetoresistance element; and
a sixth electric contact coupled to a top of the third magnetoresistance element, and experienced by
a fourth magnetoresistance element, comprising:
a fourth maximum response axis parallel to the third maximum response axis;
a fourth bias layer structure configured to generate a fourth bias magnetic field with a fourth magnetic direction parallel to the third magnetic direction and opposed to the third magnetic direction, wherein the second AC magnetic field is parallel to the third and fourth maximum response axes;
a seventh electrical contact coupled to a bottom of the fourth magnetoresistance element; and
an eighth electric contact coupled to a top of the fourth magnetoresistance element.

26. The method of claim 25, wherein the second magnetoresistance element is disposed over the first magnetoresistance element and the fourth magnetoresistance element is disposed over the third magnetoresistance element, wherein a first insulator layer is disposed between the first and second magnetoresistance elements; and wherein a second insulator layer is disposed between the third and fourth magnetoresistance elements.

27. The magnetic field sensor of claim 26, wherein the first, second, third and fourth magnetoresistance elements are TMR elements.

28. The method of claim 25, further comprising:
generating a third AC magnetic field experienced by
a fifth magnetoresistance element, comprising;
a fifth maximum response axis;
a fifth bias layer structure configured to generate a fifth bias magnetic field with a fifth magnetic direction between ninety degrees and sixty degrees relative to the fifth maximum response axis;
a ninth electrical contact coupled to a bottom of the fifth magnetoresistance element; and
a tenth electric contact coupled to a top of the fifth magnetoresistance element, and experienced by
a sixth magnetoresistance element, comprising:
a sixth maximum response axis parallel to the fifth maximum response axis;
a sixth bias layer structure configured to generate a sixth bias magnetic field with a sixth magnetic direction parallel to the fifth magnetic direction and opposed to the fifth magnetic direction;
an eleventh electrical contact coupled to a bottom of the sixth magnetoresistance element; and
a twelfth electric contact coupled to a top of the sixth magnetoresistance element, wherein the method further comprises:
generating a fourth magnetic field experienced by
a seventh magnetoresistance element, comprising:
a seventh maximum response axis;
a seventh bias layer structure configured to generate a seventh bias magnetic field with a seventh magnetic direction between ninety degrees and sixty degrees relative to the seventh maximum response axis;
a thirteenth electrical contact coupled to a bottom of the seventh magnetoresistance element; and
a fourteenth electric contact coupled to a top of the seventh magnetoresistance element, and experienced by
an eighth magnetoresistance element, comprising:
an eighth maximum response axis parallel to the seventh maximum response axis;
an eighth bias layer structure configured to generate an eighth bias magnetic field with an eighth magnetic direction parallel to the seventh magnetic direction and opposed to the seventh magnetic direction;
a fifteenth electrical contact coupled to a bottom of the eighth magnetoresistance element; and
a sixteenth electric contact coupled to a top of the eighth magnetoresistance element, wherein the third AC magnetic field is parallel to the fifth and sixth maximum response axes, and wherein the fourth AC magnetic field is parallel to the seventh and eighth maximum response axes.

29. The method of claim 28, wherein the second magnetoresistance element is disposed over the first magnetoresistance element, the fourth magnetoresistance element is disposed over the third magnetoresistance element, the sixth magnetoresistance element is disposed over the fifth magnetoresistance element, and the eighth magnetoresistance element is disposed over the seventh magnetoresistance element, wherein a first insulator layer is disposed between the first and second magnetoresistance elements, wherein a second insulator layer is disposed between the third and fourth magnetoresistance elements, wherein a third insulator layer is disposed between the fifth and sixth magnetoresistance elements, and wherein a fourth insulator layer is disposed between the seventh and eighth magnetoresistance elements.

30. The method of claim 29, wherein the first, second, third, fourth, fifth, sixth, seventh, and eighth magnetoresistance elements are TMR elements.

31. The method of claim 30, further including:
generating a first current conductor magnetic field experienced by the first, second, third and fourth magnetoresistance elements in response to a sensed current passing through a current conductor;
generating a second current conductor magnetic field experienced by the fifth, sixth, seventh, and eighth magnetoresistance elements in response to the sensed current passing through the current conductor, wherein the first current conductor magnetic field is parallel to the first, second, third, and fourth magnetic directions of the first, second, third, and fourth bias layer structures, respectively, and wherein the second current conductor magnetic field is parallel to the fifth, sixth, seventh, and eighth magnetic directions of the fifth, sixth, seventh, and eighth bias layer structures, respectively.

32. The method of claim 30, wherein the first, third, fifth, and seventh magnetoresistance elements are coupled in a first full bridge, and wherein the second, fourth, sixth, and eighth magnetoresistance elements are coupled in a second full bridge.

33. The method of claim 22, further comprising:
detecting a first amplitude of a first signal generated in response to the first full bridge; and
detecting a second amplitude of a second signal generated in response to the second full bridge.

34. The method of claim 33, wherein the detecting the first amplitude comprises detecting with a first rectifier coupled to a first filter, and wherein the detecting the second amplitude comprises detecting with a second rectifier circuit coupled to a second filter.

35. The method of claim 33, wherein the detecting the first amplitude comprises detecting with a first demodulator, and wherein the detecting the second amplitude comprises detecting with a second demodulator.

36. The method of claim 33, further comprising:
generating a weighting value from the first and second amplitudes; and
generating a function values as one minus the weight value.

37. The method of claim 36, further comprising:
generating a first product value as a product of the first amplitude and the weight value; and
generating a second product value as a product of the second amplitude and the function value; and
generating a difference value as a difference of the first and second product values.

38. A magnetic field sensor, comprising:
a substrate;
means for generating a first AC magnetic field experienced by
a first magnetoresistance element disposed over the substrate, comprising:
a first maximum response axis;
a first bias layer structure configured to generate a first bias magnetic field with a first magnetic direction between ninety degrees and sixty degrees relative to the first maximum response axis;
a first electrical contact coupled to a bottom of the first magnetoresistance element; and
a second electric contact coupled to a top of the first magnetoresistance element, and experienced by
a second magnetoresistance element disposed over the substrate, comprising:
a second maximum response axis parallel to the first maximum response axis;
a second bias layer structure configured to generate a second bias magnetic field with a second magnetic direction parallel to the first magnetic direction and opposed to the first magnetic direction, wherein the first AC magnetic field is parallel to the first and second maximum response axes;
a third electrical contact coupled to a bottom of the second magnetoresistance element; and
a fourth electric contact coupled to a top of the second magnetoresistance element.

39. The magnetic field sensor of claim 38, wherein the second magnetoresistance element is disposed over the first magnetoresistance element, and wherein the magnetic field sensor further comprises an insulator layer is-disposed between the first and second magnetoresistance elements.

40. The magnetic field sensor of claim 39, wherein the first and second magnetoresistance elements are TMR elements.

41. The magnetic field sensor of claim 38, further comprising:
means for generating a second AC magnetic field experienced by
a third magnetoresistance element disposed over the substrate, comprising:
a third maximum response axis;
a third bias layer structure configured to generate a third bias magnetic field with a third magnetic direction between ninety degrees and sixty degrees relative to the third maximum response axis;
a fifth electrical contact coupled to a bottom of the third magnetoresistance element; and
a sixth electric contact coupled to a top of the third magnetoresistance element, and experienced by
a fourth magnetoresistance element disposed over the substrate, comprising:
a fourth maximum response axis parallel to the third maximum response axis;
a fourth bias layer structure configured to generate a fourth bias magnetic field with a fourth magnetic direction parallel to the third magnetic direction and opposed to the third magnetic direction, wherein the second AC magnetic field is parallel to the third and fourth maximum response axes;
a seventh electrical contact coupled to a bottom of the fourth magnetoresistance element; and
an eighth electric contact coupled to a top of the fourth magnetoresistance element.

42. The magnetic field sensor of claim 41, wherein the second magnetoresistance element is disposed over the first magnetoresistance element and the fourth magnetoresistance element is disposed over the third magnetoresistance element, wherein the magnetic field sensor further comprises: a first insulator layer disposed between the first and second magnetoresistance elements and a second insulator layer disposed between the third and fourth magnetoresistance elements.

43. The magnetic field sensor of claim 42, wherein the first, second, third and fourth magnetoresistance elements are TMR elements.

44. The magnetic field sensor of claim 41, further comprising:
means for generating a third AC magnetic field experienced by
a fifth magnetoresistance element disposed over the substrate, comprising;
a fifth maximum response axis;
a fifth bias layer structure configured to generate a fifth bias magnetic field with a fifth magnetic direction between ninety degrees and sixty degrees relative to the fifth maximum response axis;
a ninth electrical contact coupled to a bottom of the fifth magnetoresistance element; and
a tenth electric contact coupled to a top of the fifth magnetoresistance element, and experienced by
a sixth magnetoresistance element disposed over the substrate, comprising:
a sixth maximum response axis parallel to the fifth maximum response axis;
a sixth bias layer structure configured to generate a sixth bias magnetic field with a sixth magnetic direction parallel to the fifth magnetic direction and opposed to the fifth magnetic direction;
an eleventh electrical contact coupled to a bottom of the sixth magnetoresistance element; and
a twelfth electric contact coupled to a top of the sixth magnetoresistance element, wherein the magnetic field sensor further comprises:
means for generating a fourth magnetic field experienced by
a seventh magnetoresistance element disposed over the substrate, comprising;
a seventh maximum response axis;
a seventh bias layer structure configured to generate a seventh bias magnetic field with a seventh magnetic direction between ninety degrees and sixty degrees relative to the seventh maximum response axis,
a thirteenth electrical contact coupled to a bottom of the seventh magnetoresistance element; and
a fourteenth electric contact coupled to a top of the seventh magnetoresistance element, and experienced by
an eighth magnetoresistance element disposed over the substrate, comprising:
an eighth maximum response axis parallel to the seventh maximum response axis;
an eighth bias layer structure configured to generate an eighth bias magnetic field with an eighth magnetic direction parallel to the seventh magnetic direction and opposed to the seventh magnetic direction;
a fifteenth electrical contact coupled to a bottom of the eighth magnetoresistance element; and
a sixteenth electric contact coupled to a top of the eighth magnetoresistance element, wherein the third AC magnetic field is parallel to the fifth and sixth maximum response axes, and wherein the fourth AC magnetic field is parallel to the seventh and eighth maximum response axes.

45. The magnetic field sensor of claim 44, wherein the second magnetoresistance element is disposed over the first magnetoresistance element, the fourth magnetoresistance element is disposed over the third magnetoresistance element, the sixth magnetoresistance element is disposed over the fifth magnetoresistance element, and the eighth magnetoresistance element is disposed over the seventh magnetoresistance element, wherein the magnetic field sensor further comprises:
a first insulator layer disposed between the first and second magnetoresistance elements;
a second insulator layer disposed between the third and fourth magnetoresistance elements;
a third insulator layer disposed between the fifth and sixth magnetoresistance elements; and
a fourth insulator layer disposed between the seventh and eighth magnetoresistance elements.

46. The magnetic field sensor of claim 45, wherein the first, second, third, fourth, fifth, sixth, seventh, and eighth magnetoresistance elements are TMR elements.

47. The magnetic field sensor of claim 46, further comprising:
means for generating a first current conductor magnetic field experienced by the first, second, third and fourth magnetoresistance elements in response to a sensed current passing through a current conductor,
means for generating a second current conductor magnetic field experienced by the fifth, sixth, seventh, and eighth magnetoresistance elements in response to the sensed current passing through the current conductor, wherein the first current conductor magnetic field is parallel to the first, second, third, and fourth magnetic directions of the first, second, third, and fourth bias layer structures, respectively, and wherein the second current conductor magnetic field is parallel to the fifth, sixth, seventh, and eighth magnetic directions of the fifth, sixth, seventh, and eighth bias layer structures, respectively.

48. A magnetic field sensor, comprising:
a substrate;
a first magnetoresistance element disposed over the substrate, comprising:
a first maximum response axis;
a first bias layer structure configured to generate a first bias magnetic field with a first magnetic direction between ninety degrees and sixty degrees relative to the first maximum response axis;
a first electrical contact coupled to a bottom of the first magnetoresistance element; and
a second electric contact coupled to a top of the first magnetoresistance element, wherein the magnetic field sensor further comprises:
a second magnetoresistance element disposed over the substrate, comprising:
a second maximum response axis;
a second bias layer structure configured to generate a second bias magnetic field with a second magnetic direction parallel to the first magnetic direction and opposed to the first magnetic direction;
a third electrical contact coupled to a bottom of the second magnetoresistance element; and
a fourth electric contact coupled to a top of the second magnetoresistance element, wherein the second magnetoresistance element is disposed over the first magnetoresistance element, and wherein the magnetic field sensor further comprises an insulator layer disposed between the first and second magnetoresistance elements.

49. The magnetic field sensor of claim 48, wherein the first magnetoresistance element further comprises a first reference layer structure that determines the first maximum response axis and the second magnetoresistance element further comprises a second reference layer structure that determines the second maximum response axis.

50. A method of measuring a magnetic field with a magnetic field sensor, comprising:
    generating a first AC magnetic field experienced by
    a first magnetoresistance element, comprising:
        a first maximum response axis;
        a first bias layer structure configured to generate a first bias magnetic field with a first magnetic direction between ninety degrees and sixty degrees relative to the first maximum response axis;
        a first electrical contact coupled to a bottom of the first magnetoresistance element; and
        a second electric contact coupled to a top of the first magnetoresistance element, and experienced by
    a second magnetoresistance element, comprising:
        a second maximum response axis;
        a second bias layer structure configured to generate a second bias magnetic field with a second magnetic direction parallel to the first magnetic direction and opposed to the first magnetic direction, wherein the first AC magnetic field is parallel to the first and second maximum response axes;
        a third electrical contact coupled to a bottom of the second magnetoresistance element; and
        a fourth electric contact coupled to a top of the second magnetoresistance element, wherein the second magnetoresistance element is disposed over the first magnetoresistance element, and wherein an insulator layer is disposed between the first and second magnetoresistance elements.

51. The method of claim 50, wherein the first magnetoresistance element further comprises a first reference layer structure that determines the first maximum response axis and the second magnetoresistance element further comprises a second reference layer structure that determines the second maximum response axis.

52. A magnetic field sensor, comprising:
    a substrate;
    means for generating a first AC magnetic field experienced by
    a first magnetoresistance element disposed over the substrate, comprising:
        a first maximum response axis;
        a first bias layer structure configured to generate a first bias magnetic field with a first magnetic direction between ninety degrees and sixty degrees relative to the first maximum response axis;
        a first electrical contact coupled to a bottom of the first magnetoresistance element; and
        a second electric contact coupled to a top of the first magnetoresistance element, and experienced by
    a second magnetoresistance element disposed over the substrate, comprising:
        a second maximum response axis;
        a second bias layer structure configured to generate a second bias magnetic field with a second magnetic direction parallel to the first magnetic direction and opposed to the first magnetic direction, wherein the first AC magnetic field is parallel to the first and second maximum response axes;
        a third electrical contact coupled to a bottom of the second magnetoresistance element; and
        a fourth electric contact coupled to a top of the second magnetoresistance element, wherein the second magnetoresistance element is disposed over the first magnetoresistance element, and wherein the magnetic field sensor further comprises an insulator layer disposed between the first and second magnetoresistance elements.

53. The magnetic field sensor of claim 52, wherein the first magnetoresistance element further comprises a first reference layer structure that determines the first maximum response axis and the second magnetoresistance element further comprises a second reference layer structure that determines the second maximum response axis.

\* \* \* \* \*

UNITED STATES PATENT AND TRADEMARK OFFICE
CERTIFICATE OF CORRECTION

Page 1 of 2

PATENT NO. : 10,578,684 B2
APPLICATION NO. : 15/895418
DATED : March 3, 2020
INVENTOR(S) : Bryan Cadugan et al.

It is certified that error appears in the above-identified patent and that said Letters Patent is hereby corrected as shown below:

In the Specification

Column 1, Line 48 delete "magnetoresistances" and replace with --magnetoresistance--.

Column 2, Line 13 delete "and" and replace with --an--.

Column 6, Line 60 delete "referring to" and replace with --referred to--.

Column 7, Line 31 delete "experience" and replace with --experienced--.

Column 7, Line 54 delete "referring to" and replace with --referred to--.

Column 9, Line 22 delete "and" and replace with --an--.

Column 9, Line 49 delete "element" and replace with --elements--.

Column 15, Line 16 delete "series" and replace with --coupled in series--.

Column 15, Line 16 delete "points" and replace with --forms--.

Column 15, Line 27 delete "amplitude" and replace with --analog--.

Column 15, Line 29 delete "amplitude" and replace with --analog--.

Column 15, Line 57 delete "that" and replace with --than--.

Column 16, Line 57 delete "and" and replace with --an--.

Column 16, Line 60 delete "ty" and replace with --by--.

Signed and Sealed this
Eighteenth Day of May, 2021

Drew Hirshfeld
*Performing the Functions and Duties of the*
*Under Secretary of Commerce for Intellectual Property and*
*Director of the United States Patent and Trademark Office*

CERTIFICATE OF CORRECTION (continued)
U.S. Pat. No. 10,578,684 B2

Column 17, Line 2 delete "and" and replace with --an--.

Column 17, Line 18 delete "should be" and replace with --it should be--.

Column 17, Line 22 delete "Read how to" and replace with --Referring now to--.

Column 18, Line 20 delete "beast" and replace with --be--.

Column 18, Line 23 delete "beast" and replace with --be--.

Column 18, Line 34 delete "operational the" and replace with --operation of the--.

Column 23, Line 65 delete "direction" and replace with --a direction--.

In the Claims

Column 32, Line 23 delete "is-disposed" and replace with --disposed--.